(12) United States Patent
Kohjiro et al.

(10) Patent No.: US 7,817,437 B2
(45) Date of Patent: *Oct. 19, 2010

(54) SEMICONDUCTOR DEVICE

(75) Inventors: Iwamichi Kohjiro, Komoro (JP); Yasuhiro Nunogawa, Yachiho-mura (JP); Sakae Kikuchi, Takasaki (JP); Shizuo Kondo, Takasaki (JP); Tetsuaki Adachi, Toubu-machi (JP); Osamu Kagaya, Tokyo (JP); Kenji Sekine, Hinode-machi (JP); Eiichi Hase, Iruma (JP); Kiichi Yamashita, Shiroyama-machi (JP)

(73) Assignee: Renensas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/394,421

(22) Filed: Feb. 27, 2009

(65) Prior Publication Data

US 2009/0161329 A1 Jun. 25, 2009

Related U.S. Application Data

(60) Continuation of application No. 11/905,421, filed on Oct. 1, 2007, now Pat. No. 7,525,813, which is a continuation of application No. 11/451,579, filed on Jun. 13, 2006, now abandoned, which is a continuation of application No. 11/194,701, filed on Aug. 2, 2005, now Pat. No. 7,068,521, which is a continuation of application No. 10/291,840, filed on Nov. 12, 2002, now Pat. No. 6,943,441, which is a continuation of application No. 09/970,668, filed on Oct. 5, 2001, now Pat. No. 6,489,680, which is a division of application No. 09/345,505, filed on Jul. 1, 1999, now Pat. No. 6,330,165.

(30) Foreign Application Priority Data

Jul. 6, 1998 (JP) ............................. 10-190809
Feb. 19, 1999 (JP) ............................. 11-041045

(51) Int. Cl.
H05K 7/02 (2006.01)
H05K 7/06 (2006.01)
H05K 7/08 (2006.01)
H05K 7/10 (2006.01)

(52) U.S. Cl. .................... 361/760; 361/763; 361/764; 361/765; 361/794

(58) Field of Classification Search ................. None
See application file for complete search history.

(56) References Cited

U.S. PATENT DOCUMENTS 4,193,083 A 3/1980 Max (Continued)

FOREIGN PATENT DOCUMENTS

JP 56 081962 7/1981

(Continued)

Primary Examiner—Tuan T Dinh
(74) Attorney, Agent, or Firm—Mattingly & Malur, P.C.

(57) ABSTRACT

In a semiconductor device such as a high-frequency power amplifier module, a plurality of amplifying means are formed on a semiconductor chip which is mounted on a main surface of a wiring substrate, and electrodes of the semiconductor chip are electrically connected by wires to electrodes of the wiring substrate. In order to make the high-frequency power amplifier module small in size, a substrate-side bonding electrode electrically connected to a wire set at a fixed reference electric potential is place at a location farther from a side of the semiconductor chip than a substrate-side output electrode electrically connected to an output wire. A substrate-side input electrode electrically connected to an input wire is located at a distance from the side of the semiconductor chip about equal to the distance from the side of the semiconductor chip to the substrate-side output electrode, or at a location farther from the side of the semiconductor chip than the substrate-side bonding electrode is.

7 Claims, 16 Drawing Sheets

U.S. PATENT DOCUMENTS

| | | |
|---|---|---|
| 4,410,874 A | 10/1983 | Scapple et al. |
| 4,618,879 A | 10/1986 | Mizukoshi et al. |
| 5,144,535 A | 9/1992 | Megens et al. |
| 5,198,964 A | 3/1993 | Ito et al. |
| 5,353,196 A | 10/1994 | Takahashi |
| 5,402,318 A | 3/1995 | Otsuka et al. |
| 5,455,968 A | 10/1995 | Pham |
| 5,468,999 A | 11/1995 | Lin |
| 5,606,196 A | 2/1997 | Lee et al. |
| 5,767,579 A | 6/1998 | Kanazawa et al. |
| 5,768,109 A | 6/1998 | Gulick et al. |
| 6,049,126 A | 4/2000 | Saitoh |
| 6,054,900 A | 4/2000 | Ishida et al. |
| 6,097,612 A | 8/2000 | Ishikawa et al. |
| 6,166,436 A | 12/2000 | Maeda et al. |
| 6,377,464 B1 | 4/2002 | Hashemi et al. |
| 6,400,240 B2 | 6/2002 | Nishida et al. |
| 6,741,125 B2 | 5/2004 | Arai et al. |
| 7,154,760 B2 | 12/2006 | Konishi et al. |
| 2001/0011768 A1 | 8/2001 | Kohara et al. |

FOREIGN PATENT DOCUMENTS

| | | |
|---|---|---|
| JP | 60077436 A | 5/1985 |
| JP | 362109351 A | 5/1987 |
| JP | 401243441 A | 9/1989 |
| JP | 4-221837 | 8/1992 |
| JP | 9-260412 | 10/1997 |
| JP | 09260412 A | 10/1997 |
| JP | 10-326806 | 12/1998 |
| JP | 10326806 A | 12/1998 |

SEMICONDUCTOR DEVICE

RELATED APPLICATIONS

The above-referenced patent application is a continuation application of U.S. Ser. No. 11/905,421, filed Oct. 1, 2007, now U.S. Pat. No. 7,525,813, which is a continuation application of U.S. Ser. No. 11/451,579, filed Jun. 13, 2006, now abandoned, which is a continuation application of U.S. Ser. No. 11/194,701, filed Aug. 2, 2005, now U.S. Pat. No. 7,068,521, which is a continuation application of 10/291,840, filed on Nov. 12, 2002, now U.S. Pat. No. 6,943,441, which is a continuation of U.S. Ser. No. 09/970,668, filed Oct. 5, 2001, now U.S. Pat. No. 6,489,680, which is a divisional application of U.S. Ser. No. 09/345,505, filed Jul. 1, 1999, now U.S. Pat. No. 6,330,165.

BACKGROUND OF THE INVENTION

The present invention relates to a semiconductor device. More particularly, the present invention relates to a technology effectively applicable to a semiconductor device designed into a configuration of a multistage amplifier circuit.

A semiconductor device known as a high-frequency power amplifier (or a high-frequency power module) is incorporated in a portable communication apparatus such as a portable telephone or a car telephone of the PDC (Personal Digital Cellular) system or a portable telephone of the PHS (Personal Handyphone System). This high-frequency power amplifier is designed into a configuration of a multistage amplifier circuit in which a plurality of amplifying means are electrically connected to each other to form a multistage structure.

The high-frequency power amplifier is built by mounting a semiconductor chip on a main surface of a wiring substrate. The semiconductor chip has an amplifying means formed on a main surface thereof. Electrodes formed on a main surface of the semiconductor chip are electrically connected to electrodes formed on a main surface of the wiring substrate by conductive wires. The amplifying means has a configuration in which typically a plurality of field-effect transistors are electrically connected to each other to form a parallel circuit. A gate terminal (serving as the input unit) of the amplifying means is electrically connected to a chip-side input electrode formed on the main surface of the semiconductor chip. On the other hand, a drain terminal (serving as the output unit) of the amplifying means is electrically connected to a chip-side output electrode formed on the main surface of the semiconductor chip. The chip-side input electrode is placed at a position on a particular side of the semiconductor chip whereas the chip-side output electrode is placed at a position on another side of the semiconductor chip facing the particular side. A source terminal of the amplifying means is electrically connected to a back-surface electrode formed on a back surface of another semiconductor chip facing the main surface. The back-surface electrode is fixed at a reference electric potential. The chip-side input electrode is electrically connected to a substrate-side input electrode formed on the main surface of the wiring substrate by an input wire. The substrate-side input electrode is placed at a position facing the particular side of the semiconductor chip cited above. The chip-side output electrode is electrically connected to a substrate-side output electrode formed on the main surface of the wiring substrate by an output wire. The substrate-side output electrode is placed at a position facing the other side of the semiconductor chip cited above.

By the way, in order to reduce the size and the cost of the high-frequency power amplifier, an attempt has been made to form a plurality of amplifying means on one semiconductor chip. In the case of two amplifying means formed on one semiconductor chip, for example, the amplifying means at the front stage is oriented in a direction opposite to a direction in which the amplifying means at the rear stage is oriented so that the input and the output of the amplifying means at the front stage are placed at locations in close proximity to respectively the output and the input of the amplifying means at the rear stage. As a result, the input and output wires at the front stage and the output and input wires at the rear stage are close to each other. As a result, there is raised a problem of a deteriorating high-frequency characteristic due to a mutual-induction effect between the input and output wires. In particular, the mutual-induction effect between the input wire of the front stage and the output wire of the rear stage is a serious problem since a difference between a power flowing through the input wire and a power flowing through the output wire is big.

A technology to prevent the high-frequency characteristic from deteriorating due to a mutual-induction effect between wires is disclosed for example in Japanese Patent Laid-open No. Hei 9-260412 (1997). According to this technology, a chip-side bonding electrode is formed between the chip-side input electrode and the chip-side output electrode whereas a substrate-side bonding electrode is formed between the substrate-side input electrode and the substrate-side output electrode. The chip-side bonding electrode is electrically connected to the substrate-side bonding electrode and, by fixing the chip-side bonding electrode and the substrate-side bonding electrode at a reference electric potential, the high-frequency characteristic can be prevented from deteriorating due to a mutual-induction effect between the input and output wires.

In addition, the high-frequency power amplifier module employing transistors is a key device of a portable telephone of mobile communication adopting systems such as the PDC (Personal Digital Cellular) system and the GSM (Global System for Mobile communication). The demand for such a portable telephone has been growing tremendously in recent years. Specifications of such a high-frequency power amplifier include a small size and a low cost in addition to good high-frequency characteristics for applications to mobile communication systems.

A technique to respond to such a demand is disclosed in Japanese Patent Laid-open No. 2755250. By placing 2 transistors, namely, a first-stage transistor 2000 and a second-stage transistor 3000, at locations close to each other on a semiconductor chip 1000 as shown in a top-view diagram of FIG. 21 and a squint-view diagram of FIG. 22, the size and the cost can be reduced. A bonding input electrode 2000b of the first-stage transistor 2000 is electrically connected to a bonding electrode 7000d of a wiring substrate 6000 by an input bonding wire 9000d. A bonding output electrode 3000c of the second-stage transistor 3000 is electrically connected to a bonding electrode 7000a of the wiring substrate 6000 by an output bonding wire 9000a. A bonding electrode 10000a on the semiconductor chip 1000 is electrically connected to a bonding electrode 12000a of the wiring substrate 6000 by a shield bonding wire 13000a. The shield bonding wire 13000a is provided between the input bonding wire 9000d and the output bonding wire 9000a. The bonding electrode 10000a and the bonding electrode 12000a at the ends of the shield bonding wire 13000a are connected to the ground at high frequencies by via holes bored through the semiconductor chip 1000 and the wiring substrate. It should be noted that the via holes themselves are not shown in the figure. By providing a shield bonding wire 13000a, the amount of coupling through a mutual inductance between the input bonding wire 9000d and the output bonding wire 9000a can be reduced, allowing the degree of deterioration of isolation between the high-frequency input and output terminals to be lowered. As a result, the high-frequency characteristic is improved.

The problem of coupling through a mutual inductance between the input bonding wire 9000d and the output bonding wire 9000a is raised by a location of the input of the first-stage transistor 2000 in close proximity to a location of the output of the second-stage transistor 3000 and a location of the output of the first-stage transistor 2000 in close proximity to the location of the input of the second-stage transistor 3000 which are caused by the fact that the first-stage transistor 2000 and the second-stage transistor 3000 are oriented in directions opposite to each other. In particular, the mutual-induction effect between the input bonding wire 9000d of the first-stage transistor 2000 and the output bonding wire 9000a of the second-stage transistor 3000 is a serious problem. This is because the high-frequency power output by the second-stage transistor 3000 is higher than the high-frequency power input to the first-stage transistor 2000 by 20 to 30 dB (or 100 to 1,000 times), giving rise to a positive feedback from the output to the input. Even though the output bonding wire 9000c of the first-stage transistor 2000 and the input bonding wire 9000b of the second-stage transistor 3000 are also close to each other, the problem of a deteriorating high-frequency characteristic caused by a mutual-induction effect does not arise due to the fact that a ratio of a high-frequency power flowing through the input bonding wire 9000b to a high-frequency power flowing through the output bonding wire 9000c is not greater than 0 dB (1 time).

In FIGS. 21 and 22, reference numerals 2000a and 3000a denote the main bodies of the first-stage transistor 2000 and the second-stage transistor 3000 respectively. Reference numerals 2000d and 3000d denote the source electrodes of the first-stage transistor 2000 and the second-stage transistor 3000 respectively. Reference numeral 2000c denotes the bonding output electrode of the first-stage transistor 2000 and reference numeral 3000b denotes the bonding input electrode of the second-stage transistor 3000. Reference numeral 4000 denotes a ground electrode whereas reference numerals 7000b and 7000c each denote a bonding electrode of the wiring substrate 6000. Reference numerals 8000a to 8000d each denote a lead electrode and reference numeral 104 denotes a cavity.

SUMMARY OF THE INVENTION

As a result of a study of the technology described above, however, the inventors of the present invention identified the following problems.

The substrate-side bonding electrode is placed between the substrate-side input electrode and the substrate-side output elect rode. That is, the substrate-side input electrode, the substrate-side bonding electrode and the substrate-side output electrode are laid out along a straight line beside a side of the semiconductor chip.

In general, the substrate-side electrode is formed by adopting a screen printing technique. Thus, the area occupied by the substrate-side electrode is larger than the chip-side electrode which is formed by adopting a photolithography technique. In addition, a through-hole wire is formed right below the substrate-side electrode in order to make the propagation path short. Since the area of the through-hole wire in the plane direction (that is, the external size) has to be increased to a certain degree in order to give a low resistance, the area occupied by the substrate-side electrode becomes larger.

Thus, when the substrate-side input electrode, the substrate-side bonding electrode and the substrate-side output electrode are laid out along a straight line beside a side of the semiconductor chip, the array of these electrodes is long. As a result, the chip-side input electrode and the substrate-side input electrode do not face each other anymore and, at the same time, the chip-side output electrode and the substrate-side output electrode also do not face each other as well. For this reason, the input and output wires become longer. When the input and output wires become longer, the inductance increases, causing the high-frequency characteristic to deteriorate. As a consequence, the gap between the amplifying means at the front stage and the amplifying means at the rear stage needs to be widened to make the input and output wires shorter. In this case, however, the area occupied by the semiconductor chip increases, giving rise to a hindrance to miniaturization of the high-frequency power amplifier.

An effect of the shield bonding wire 13000a of the conventional technology described above is explained by referring to FIG. 15. FIG. 15 is a diagram showing computed values of a coupling coefficient (or the mutual inductance expressed in terms of nH) between parallel input and output bonding wires of an amplifier. The 2 bonding wires each have a length of 1 mm (which is close to the real thing) and have bonding portions separated from each other by a distance d. A dotted line representing a coupling coefficient of 0.12 shows that the amplifier operates in a stable state for a coupling coefficient of 0.12 or smaller. The value 0.12 is found from FIG. 16 which shows a relation between the coupling coefficient and a coefficient of stability of the amplifier. The amplifier operates in a stable state for a coefficient of stability of at least 1. The bonding distance d cited above is defined as a distance between the centers of the bonding portions of the 2 bonding wires which are closest to each other.

FIG. 15 indicates that the conventional technology taking a countermeasure of providing shield bonding wires results in small coupling coefficients in comparison with a case with no shield bonding wires (which is denoted by a phrase 'No countermeasure' in the figure) and, hence, exhibits an improved high-frequency characteristic. In addition, for coupling coefficients not exceeding 0.12, the countermeasure allows a wider range of the distance d between bonding portions, raising the degree of design freedom. Moreover, the distance d between bonding portions can be decreased to 0.55 mm, allowing the chip area to be made smaller. As a result, the module can be made small in size and the cost can be reduced.

In actuality, however, since the inductance of a via hole is added in series to each end of the shield bonding wire 13000a, a sufficient improvement of the high-frequency characteristic can not be achieved by the conventional technology.

It is thus an object of the present invention to provide a technology that is capable of making a semiconductor device small in size.

To be more specific, it is an object of the present invention to provide a high-frequency power amplifier module that is capable of further improving the high-frequency characteristic thereof.

The present invention as well as other objects and novel characteristics thereof will become more apparent from the description of this specification and accompanying diagrams.

An outline of a representative of the present invention disclosed in this patent application is described briefly as follows.

A semiconductor device comprises: a semiconductor chip having a square surface; a wiring substrate having a main surface thereof used for mounting the semiconductor chip; a first electrode formed on a first area of a main surface of the semiconductor chip and placed at a location in close proximity to a side of the semiconductor chip; first amplifying means formed on the first area of the main surface of the semiconductor chip and provided with an input unit electrically connected to the first electrode; a second electrode formed on a second area of the main surface of the semiconductor chip and placed at a location in close proximity to the side of the semiconductor chip; second amplifying means formed on the second area of the main surface of the semiconductor chip and provided with an output unit electrically connected to the second electrode; a third electrode formed on a third area between the first and second areas of the main surface of the semiconductor chip; a fourth electrode formed on the main surface of the wiring substrate to face the side of the semiconductor chip and electrically connected to the first electrode by a first wire; a fifth electrode formed on the main surface of the wiring substrate to face the side of the semiconductor chip and electrically connected to the second electrode by a second wire; and a sixth electrode formed on the main surface of the wiring substrate to face the side of the semiconductor chip and electrically connected to the third electrode by a third wire with an electric potential thereof fixed at a reference level, wherein:

the sixth electrode is placed at a location farther from the side of the semiconductor chip than the fifth electrode; and the fourth electrode is placed at a distance from the side of the semiconductor chip about equal to a distance of the fifth electrode from the side of the semiconductor chip or at a location farther from the side of the semiconductor chip than the sixth electrode. Since a gap between the fourth and fifth electrodes in the semiconductor chip described above can be narrowed by an amount corresponding to the size of an area occupied by the sixth electrode, a gap between the first and second areas can also be made narrow as well. As a result, since the area occupied by the semiconductor chip can be shrunk, the semiconductor chip can also be made small in size.

In addition, the objects described above can be achieved by a high-frequency power amplifier module having a semiconductor chip thereof provided on a wiring substrate having a base thereof made of a dielectric material. The high-frequency power amplifier module is designed into a configuration wherein: amplifying transistors of two or more stages, a bonding input electrode for inputting a high-frequency power to the amplifying transistors and a bonding output electrode for outputting a high-frequency power from the amplifying transistors are provided on the semiconductor chip; an angle formed by a first auxiliary line connecting bonding portions to each other at the two ends of an input bonding wire connecting the bonding input electrode for a specific one of the amplifying transistors to the wiring substrate and a second auxiliary line connecting bonding portions (their centers) to each other at the two ends of an output bonding wire connecting the bonding output electrode for another amplifying transistor at a stage following the specific amplifying transistor to the wiring substrate is in the range 72 degrees to 180 degrees; and a gap between bonding portions of the bonding input electrode and the bonding output electrode is at least 0.3 mm but smaller than 0.8 mm.

In spite of the condition stipulating that the gap between bonding portions of the bonding input electrode and the bonding output electrode is at least 0.3 mm but smaller than 0.8 mm, the above objects can be achieved provided that the high-frequency power amplifier module is designed to give a coefficient of stability of at least one between the two amplifying transistors.

DESCRIPTION OF THE PREFERRED EMBODIMENT

The configuration of the present invention is explained below along with embodiments applying the present invention to a high-frequency power amplifier (high-frequency power module) incorporated in a portable communication apparatus such as a car telephone or a portable telephone.

First Embodiment

Figure 1:
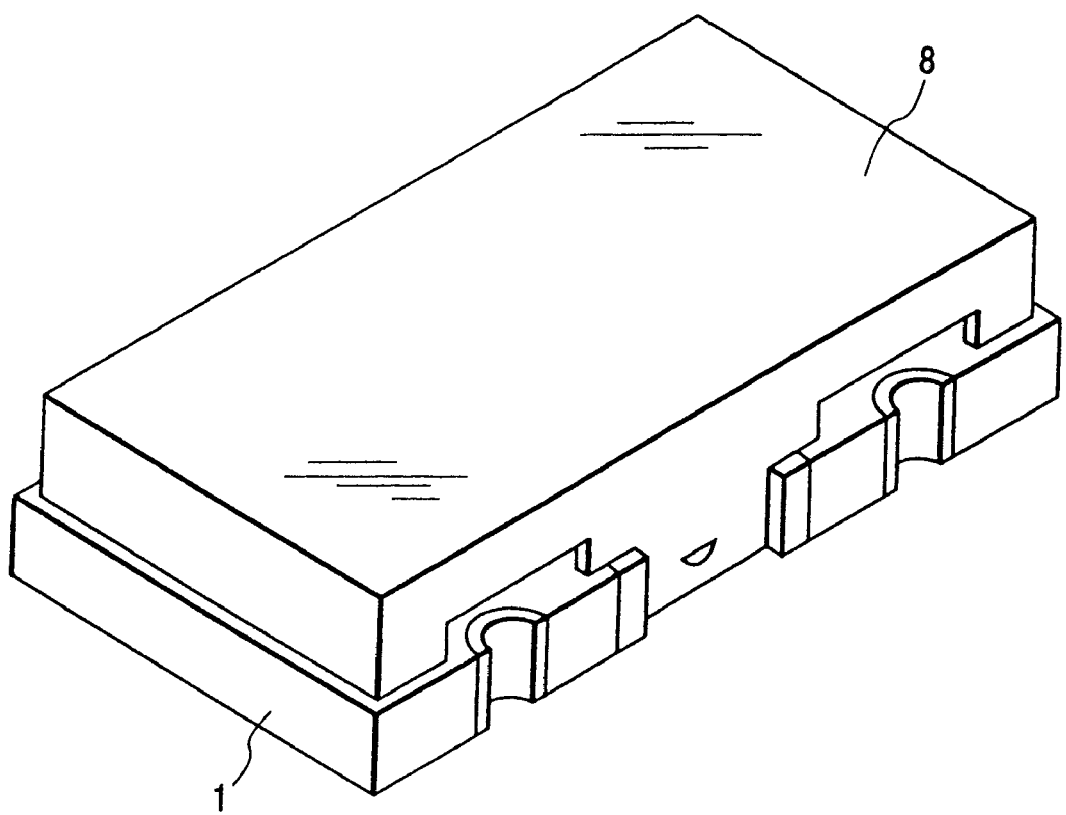
FIG. 1 is a diagram showing a perspective view of the external configuration of a high-frequency power amplifier implemented by a first embodiment of the present invention.
Figure 2:
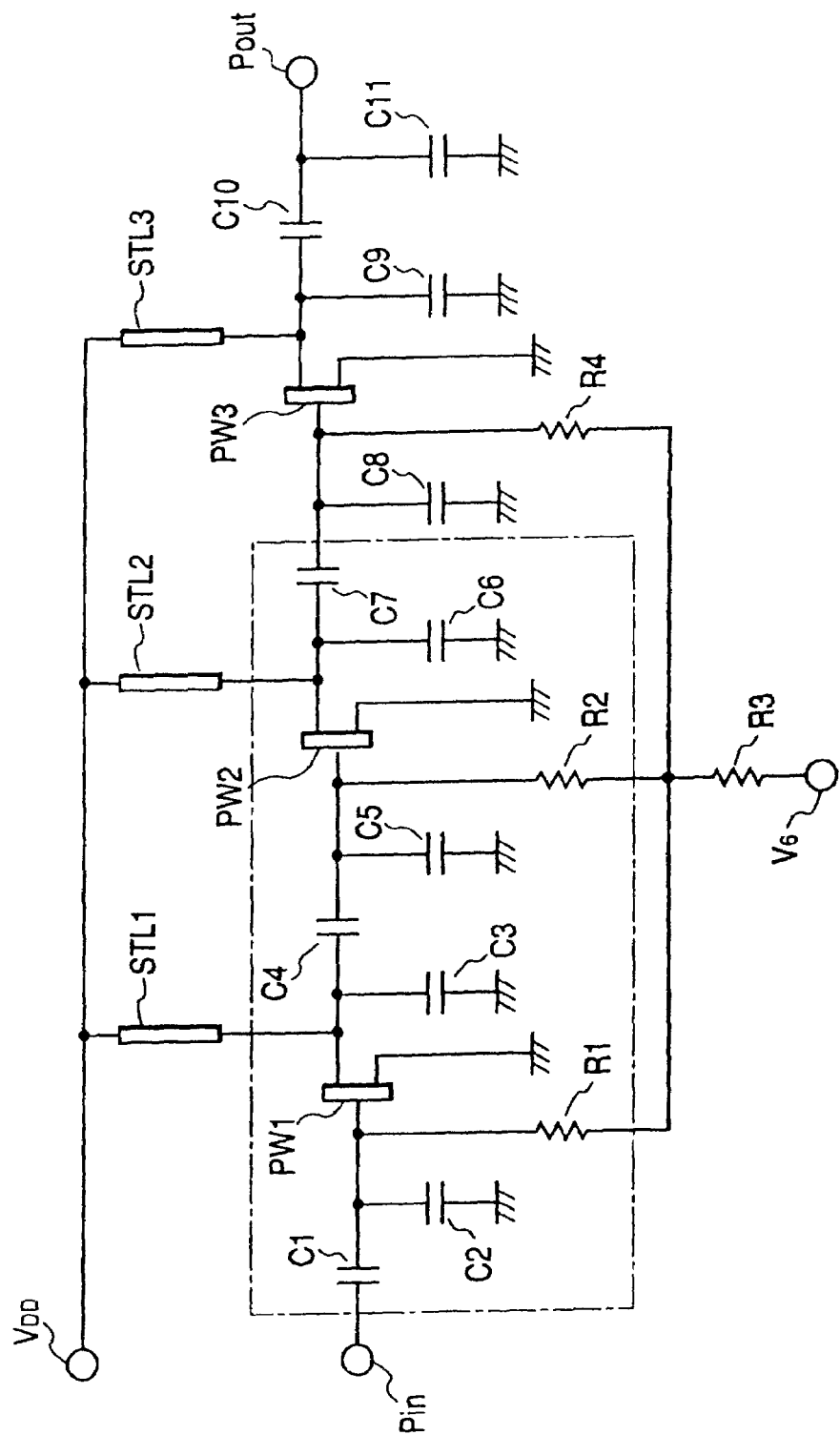
FIG. 2 is an equivalent circuit diagram of the high-frequency power amplifier.
Figure 3:
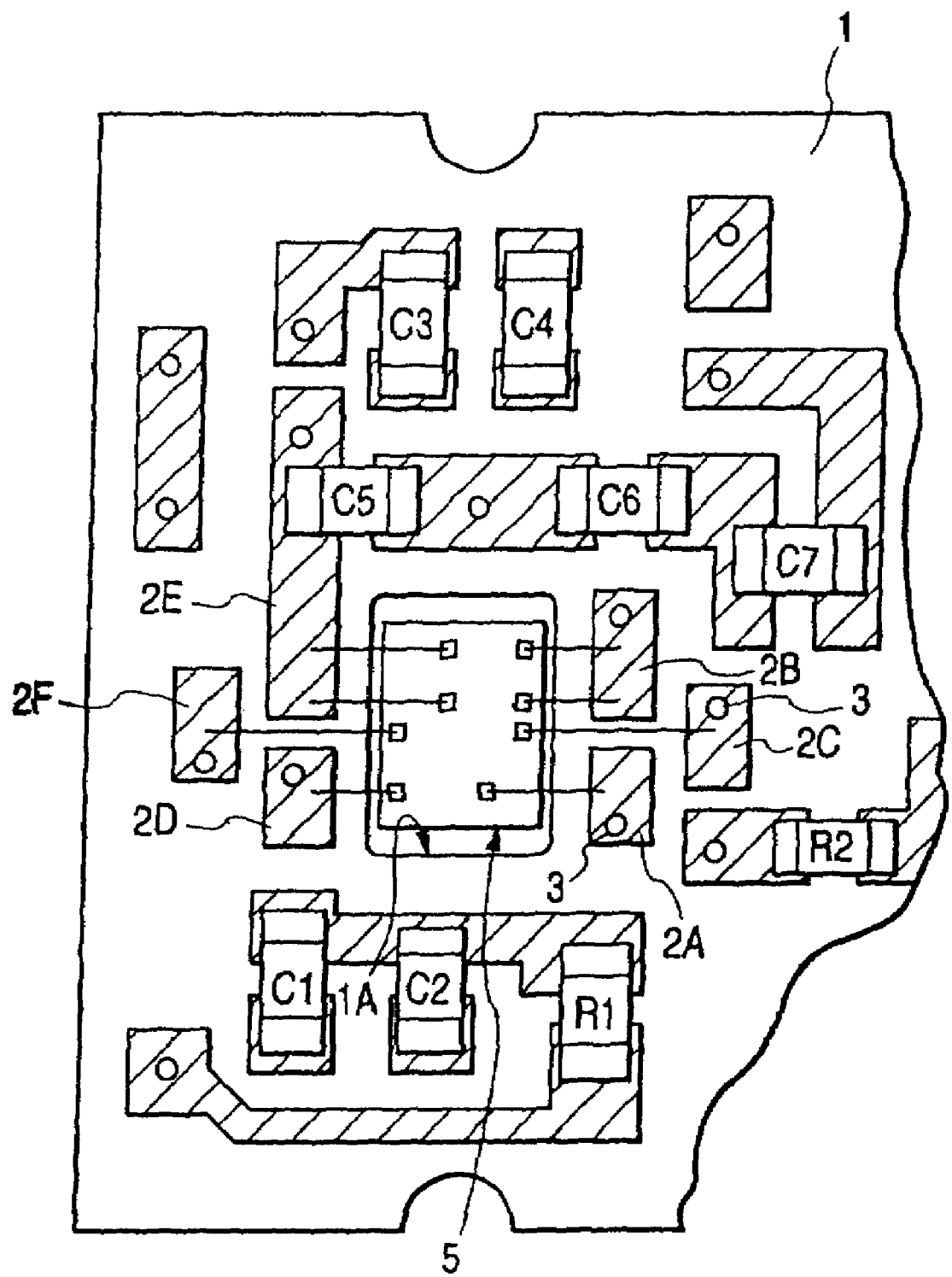
FIG. 3 is a diagram showing a top view of principal parts of a wiring substrate corresponding to a portion enclosed by a single-dotted line in FIG. 2.
Figure 4:
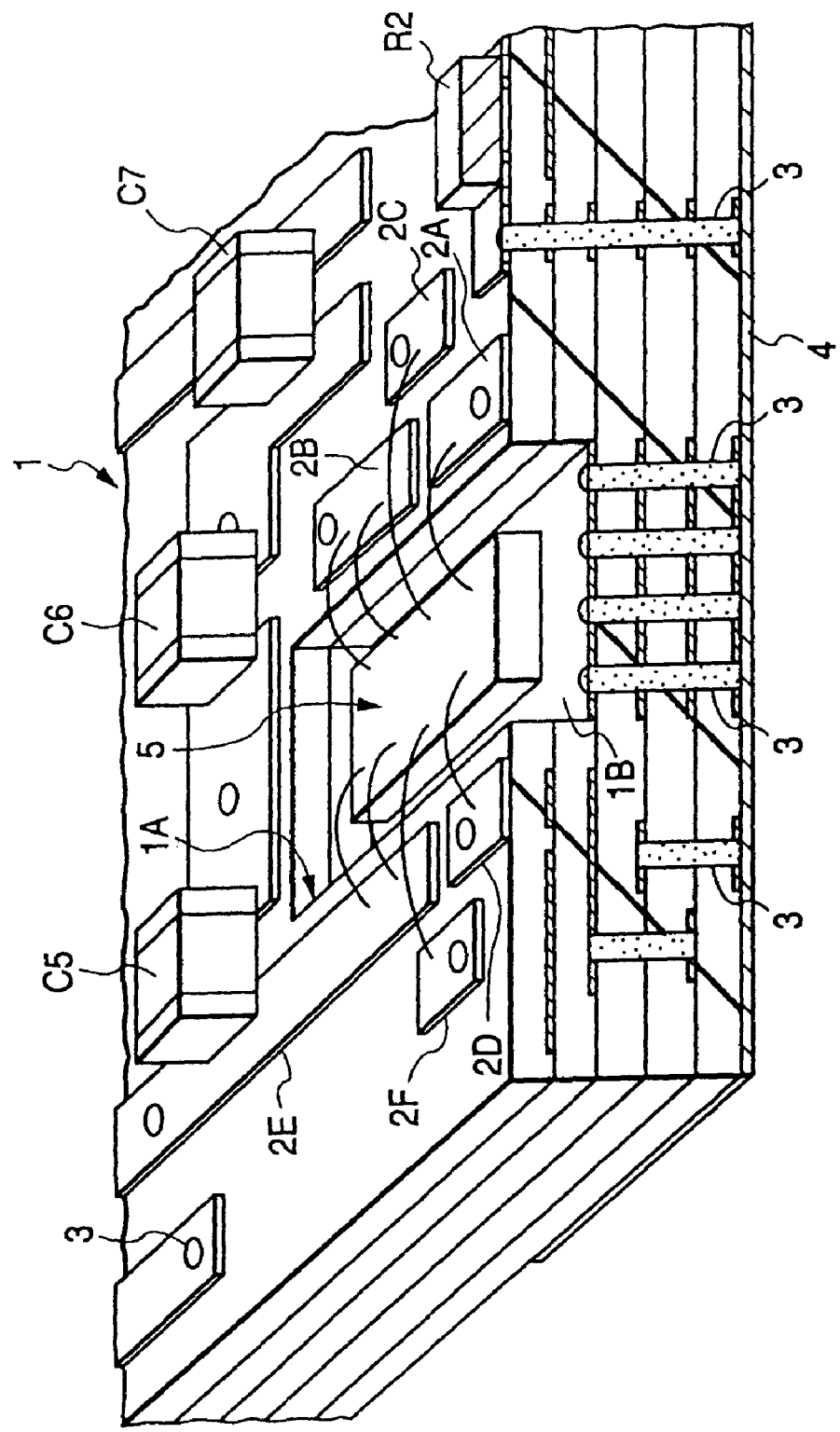
FIG. 4 is a diagram showing a perspective view of the principal parts shown in FIG. 3.
Figure 5:
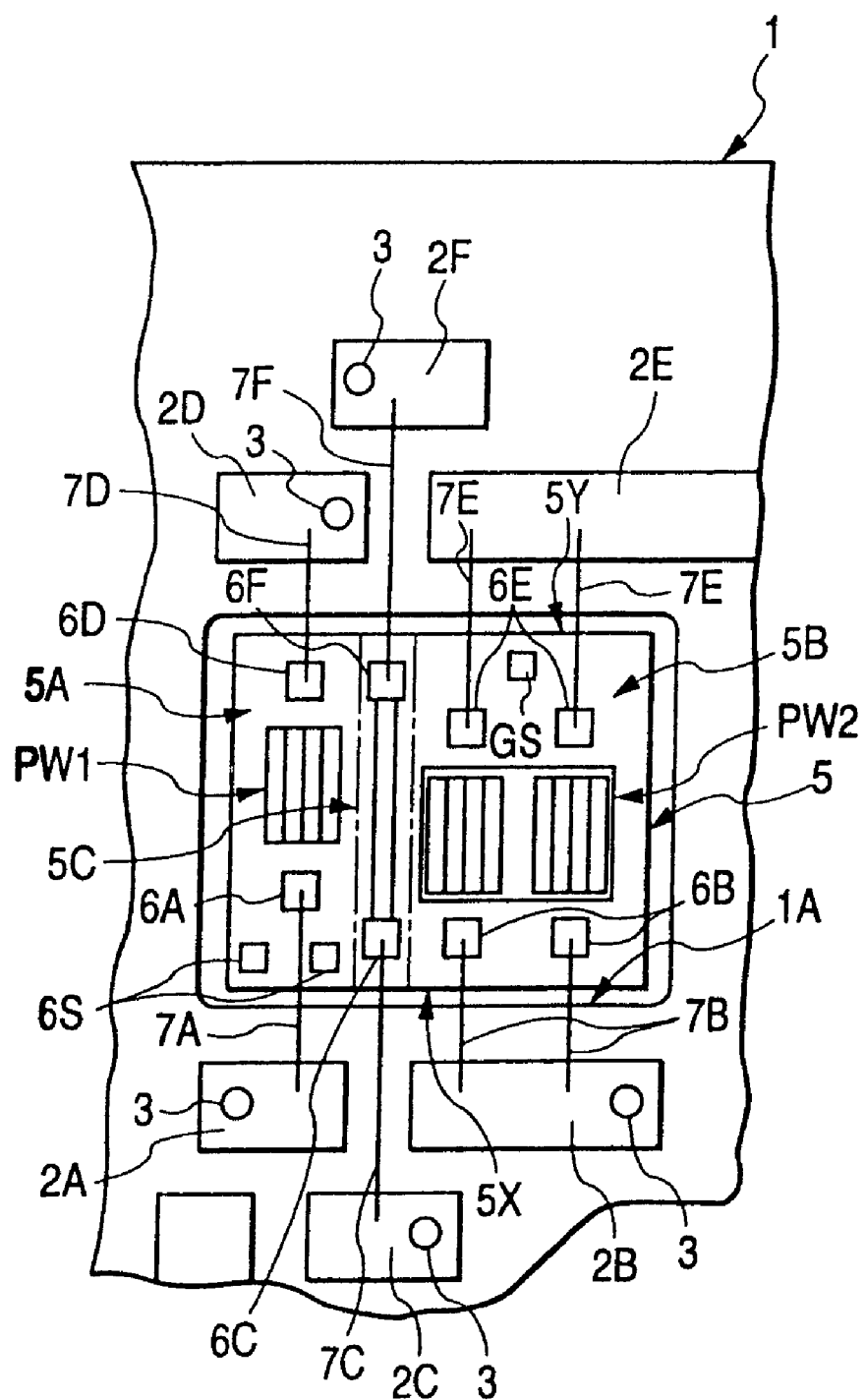
FIG. 5 is an enlarged diagram showing a perspective view of the principal parts shown in FIG. 3.
Figure 6:
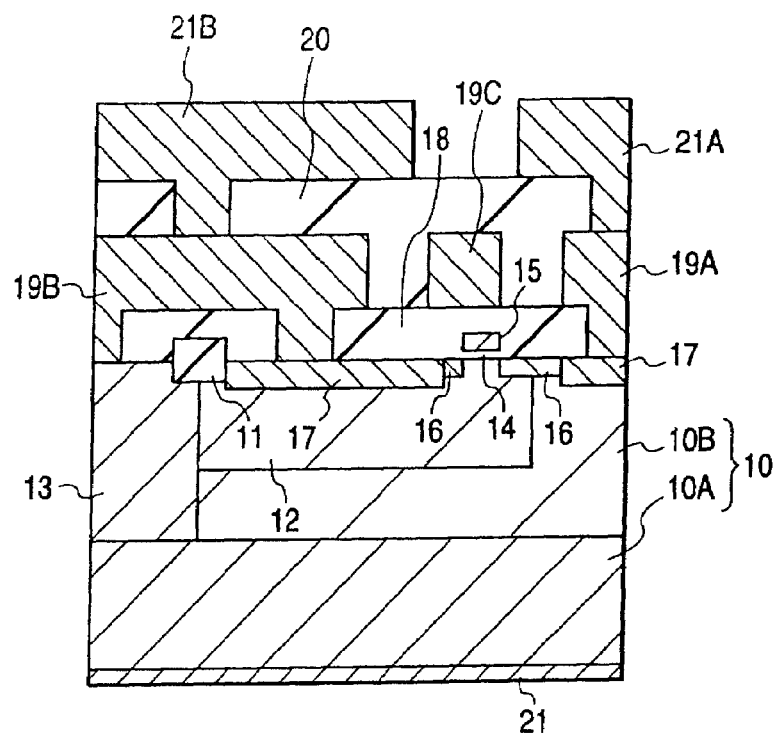
FIG. 6 is a diagram showing a cross section of principal parts in a transistor formation area of a semiconductor chip incorporated in the high-frequency power amplifier.
Figure 7:
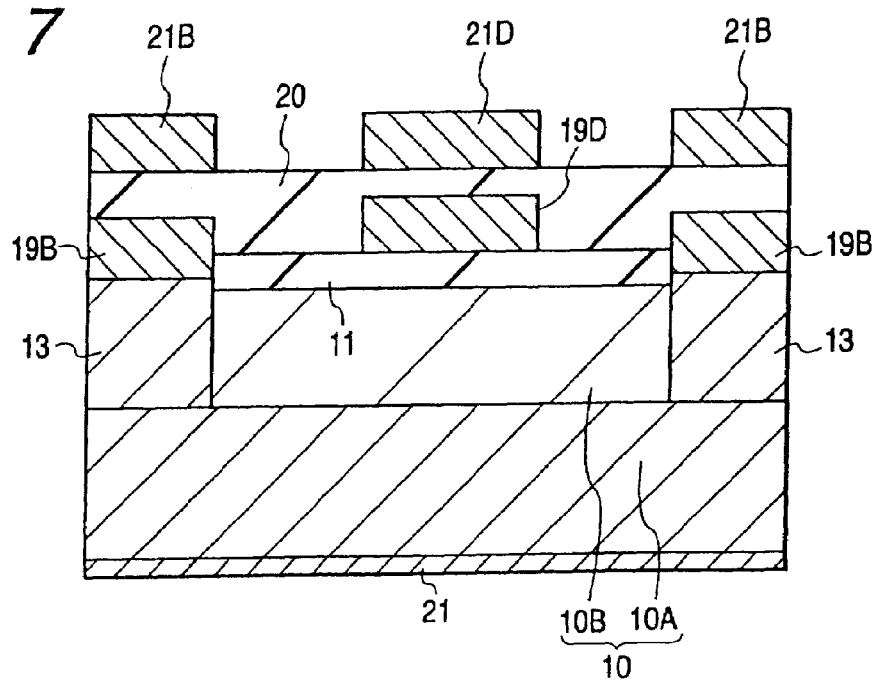
FIG. 7 is a diagram showing a cross section of principal parts in an isolation area of the semiconductor chip.

FIG. 1 is a diagram showing a perspective view of the external configuration of a high-frequency power amplifier implemented by a first embodiment of the present invention. FIG. 2 is an equivalent circuit diagram of the high-frequency power amplifier. FIG. 3 is a diagram showing a top view of principal parts of a wiring substrate corresponding to a portion enclosed by a single-dotted line in FIG. 2. FIG. 4 is a diagram showing a perspective view of the principal parts shown in FIG. 3. FIG. 5 is an enlarged diagram showing a perspective view of the principal parts shown in FIG. 3. FIG. 6 is a diagram showing a cross section of principal parts in a transistor formation area of a semiconductor chip incorporated in the high-frequency power amplifier. FIG. 7 is a diagram showing a cross section of principal parts in an isolation area of the semiconductor chip.

As shown in FIG. 1, in the high-frequency power amplifier implemented by the embodiment, a cap 8 is placed on a main surface of a plane wiring substrate 1 to form a flat cubic structure when viewed from an external position. The wiring substrate 1 is built from a ceramics substrate with a multilayer wiring structure having a surface thereof formed into a square shape (actually into a rectangular shape in the case of this embodiment). On the other hand, the surface of the cap 8 is made from a conductive metallic material with a surface thereof formed into a square shape (actually into a rectangular shape in the case of this embodiment). The cap 8 is set at a fixed reference electric potential of typically 0 [V] in order to provide a shield effect.

As shown in FIG. 2, the high-frequency power amplifier is configured into a multistage amplifying circuit. The multistage amplifying circuit includes mainly capacitive elements C1 to C11, resistive elements R1 to R4, microstrip lines STL1 to STL3 and amplifying stages PW1 to PW3.

Each of the amplifying means PW1, PW2 and PW3 comprises a plurality of field-effect transistors which are electrically connected to each other to form a parallel circuit. The amplifying means PW1 is formed with a total extent length of the gate thereof set at about 4,000 μm and the amplifying means PW2 is formed with a total extent length of the gate thereof set at about 3,200 μm. The amplifying means PW3 is formed with a total extent length of the gate thereof set at about 8,000 μm.

The gate terminal (serving as the input unit) of the amplifying means PW1 is electrically connected to an input external terminal Pin to which a high-frequency power of typically 1 [mW] is applied. On the other hand, the drain terminal (serving as the output unit) of the amplifying means PW1 is electrically connected to the gate terminal (serving as the input unit) of the amplifying means PW2 provided at a stage following the amplifying means PW1 and one end of a microstrip line STL1. Further, the drain terminal (serving as the output unit) of the amplifying means PW2 is electrically connected to the gate terminal (serving as the input unit) of the amplifying means PW3 provided at a stage following the amplifying means PW2 and one end of a microstrip line STL2. The drain terminal (serving as the output unit) of the amplifying means PW3 is electrically connected to an output external terminal Pout and one end of a microstrip line STL3.

The source terminal of each of the amplifying means PW1, PW2 and PW3 is electrically connected to a reference-potential external terminal which is set at a fixed reference electric potential of typically 0 [V]. The other end of each of the microstrip lines STL1, STL2 and STL3 is electrically connected to a power-supply-potential external terminal $V_{DD}$ to which a power-supply electric potential of typically 3.5 V is applied. It should be noted that the gate terminal of each of the amplifying means PW1, PW2 and PW3 is electrically connected to a gate external terminal VG. A voltage or an APC (Automatic Power Control) signal for adjusting an output power is applied to the gate external terminal $V_G$.

The amplifying means PW1 and PW2 are formed on the semiconductor chip 5 shown in FIG. 3. On the other hand, the amplifying means PW3 is formed on a semiconductor chip other than the semiconductor chip 5. It should be noted that the other semiconductor chip is shown in none of the figures. The semiconductor chip 5 is mounted in a dent 1A formed on the main surface of the wiring substrate 1 whereas the other semiconductor chip is mounted in another dent formed also on the main surface of the wiring substrate 1. That is, the semiconductor chips used for creating the amplifying means PW1, PW2 and PW3 are mounted on the main surface of the wiring substrate 1. The semiconductor chip 5 and the other semiconductor chip are each formed with a surface thereof having a square shape (actually a rectangular shape in the case of this embodiment). It should be noted that there will be provided no further description of the other semiconductor chip used for creating the amplifying means PW3.

As shown in FIG. 4, a conductive plate 1B is formed on the bottom of the dent 1A for mounting the semiconductor chip 5. The conductive plate 1B is electrically connected to a reference-potential external terminal 4 formed on another main surface (back surface) of the wiring substrate 1 facing the main surface cited above through a through-hole wire 3 formed right below the conductive plate 1B. The reference-potential external terminal 4 is set at a fixed electric potential of typically 0 [V]. It should be noted that the input external terminal Pin, the output external terminal Pout, the power-supply-potential external terminal $V_{DD}$ and the gate external terminal $V_G$ are each formed on the back surface of the wiring substrate 1.

As shown in FIG. 5, the amplifying means PW1 is formed on a first area 5A of the main surface of the semiconductor chip 5. The gate terminal of the amplifying means PW1 is formed on the first area 5A of the main surface of the semiconductor chip 5 and electrically connected to a chip-side input electrode 6A placed at a location in close proximity to a side 5X of the semiconductor chip 5 (one of the long sides in the case of this embodiment). On the other hand, the drain terminal of the amplifying means PW1 is formed on the first area 5A of the main surface of the semiconductor chip 5 and electrically connected to a chip-side output electrode 6D placed at a location in close proximity to a side 5Y of the semiconductor chip 5 (the other long side in the case of this embodiment) facing the side 5X.

The amplifying means PW2 is formed on a second area 5B of the main surface of the semiconductor chip 5. The drain terminal of the amplifying means PW2 is formed on the second area 5B of the main surface of the semiconductor chip 5 and electrically connected to a chip-side output electrode 6B placed at a location in close proximity to the side 5X of the semiconductor chip 5. On the other hand, the gate terminal of the amplifying means PW2 is formed on the second area 5B of the main surface of the semiconductor chip 5 and electrically connected to a chip-side input electrode 6E placed at a location in close proximity to the side 5Y of the semiconductor chip 5.

The source terminals of the amplifying means PW1 and PW2 are electrically connected to a back-surface electrode formed on a main back surface of the semiconductor chip 5 facing the main surface cited above. The source terminals of the amplifying means PW1 and PW2 will be described later in detail.

A third area 5C (serving as an isolation area) is formed between the first area 5A and the second area 5B on the main surface of the semiconductor chip 5 to electrically separate the first area 5A and the second area 5B from each other. In the third area 5C, a chip-side bonding electrode 6C is formed at a location in close proximity to the side 5X of the semiconductor chip 5 and a chip-side bonding electrode 6F is formed at a location in close proximity to the side 5Y of the semiconductor chip 5.

The chip-side input electrode 6A is electrically connected by an input wire 7A to a substrate-side input electrode 2A which is formed on the main surface of the wiring substrate 1 to face the side SX of the semiconductor chip 5. The substrate-side input electrode 2A is electrically connected to the input external terminal Pin formed on the back surface of the wiring substrate 1 by an internal wire and a through-hole wire 3 bored at a location right below the substrate-side input electrode 2A.

The chip-side output electrode 6B is electrically connected by an output wire 7B to a substrate-side output electrode 2B which is formed on the main surface of the wiring substrate 1 to face the side 5X of the semiconductor chip 5. The substrate-side output electrode 2B is electrically connected by an internal wire and a through-hole wire 3 bored at a location right below the substrate-side output electrode 2B to a substrate input terminal formed on the main surface of the wiring substrate 1 to face a side of the other semiconductor chip for creating the amplifying means PW3.

The chip-side bonding electrode 6C is electrically connected by a wire 7C to a substrate-side bonding electrode 2C which is formed on the main surface of the wiring substrate 1 to face the side 5X of the semiconductor chip 5. The substrate-side bonding electrode 2C is electrically connected by an internal wire and a through-hole wire 3 bored at a location right below the substrate-side bonding electrode 2C to the reference-potential external terminal 4 (FIG. 4) formed on the back surface of the wiring substrate 1. In such an arrangement, the wire 7C is thus set at a fixed reference electric potential.

The chip-side output electrode 6D is electrically connected by an output wire 7D to a substrate-side output electrode 2D which is formed on the main surface of the wiring substrate 1 to face the other side 5Y of the semiconductor chip 5. A through-hole wire 3 is bored at a location right below the substrate-side output electrode 2D.

The chip-side input electrode 6E is electrically connected by an input wire 7E to a substrate-side input electrode 2E which is formed on the main surface of the wiring substrate 1 to face the other side 5Y of the semiconductor chip 5. The substrate-side input electrode 2E is electrically connected by an internal wire and a through-hole wire 3 to the substrate-side output electrode 2D.

The chip-side bonding electrode 6F is electrically connected by a wire 7F to a substrate-side bonding electrode 2F which is formed on the main surface of the wiring substrate 1 to face the other side 5Y of the semiconductor chip 5. The substrate-side bonding electrode 2F is electrically connected by an internal wire and a through-hole wire 3 bored at a location right below the substrate-side bonding electrode 2F to the reference-potential external terminal 4 formed on the back surface of the wiring substrate 1. In such an arrangement, the wire 7F is thus set at a fixed reference electric potential.

The distance between the chip-side output electrode 6D and the other side 5Y of the semiconductor chip 5 is shorter than the distance between the chip-side input electrode 6A and the side 5X of the semiconductor chip 5. In addition, the distance between the chip-side output electrode 6B and the side 5X of the semiconductor chip 5 is shorter than the distance between the chip-side input electrode 6E and the other side 5Y of the semiconductor chip 5. In this way, the output wires are each short to give a small output resistance.

A source electrode 6S electrically connected to the source terminal of the amplifying means PW1 is formed on the first area 5A of the main surface of the semiconductor chip 5. The source electrode 6S is placed at a location in closer proximity to the side 5X of the semiconductor chip 5 than the chip-side input electrode 6A is. A source electrode 6S electrically connected to the source terminal of the amplifying means PW2 is formed on the second area 5B of the main surface of the semiconductor chip 5. These source electrodes 6S are used for probe inspection.

In the high-frequency power amplifier implemented by this embodiment, the input wire 7A and the output wire 7B are placed at locations close to each other. The input wire 7A is electrically connected to the gate terminal (serving as the input unit) of the amplifying means PW1 and the output wire 7B is electrically connected to the drain terminal (serving as the output unit) of the amplifying means PW2. Thus, a difference between a power flowing through the input wire 7A and a power flowing through the output wire 7B is big. Since the wire 7C set at a fixed reference electric potential is placed between the input wire 7A and the output wire 7B, however, it is possible to prevent the high-frequency characteristic from deteriorating due to a mutual-induction effect between the input wire 7A and the output wire 7B.

Further, the output wire 7D and the input wire 7E are placed at locations close to each other. The output wire 7D is electrically connected to the drain terminal (serving as the output unit) of the amplifying means PW1 and the input wire 7E is electrically connected to the gate terminal (serving as the input unit) of the amplifying means PW2. Thus, the magnitude of a power flowing through the output wire 7D is about equal to the magnitude of a power flowing through the input wire 7E. As a result, the high-frequency characteristic deteriorates only a little due to a mutual-induction effect between the output wire 7D and the input wire 7E. In addition, since the wire 7F set at a fixed reference electric potential is placed between the output wire 7D and the input wire 7E, it is possible to prevent the high-frequency characteristic from further deteriorating due to the mutual-induction effect between the output wire 7D an the input wire 7E.

The substrate-side bonding electrode 2C is placed at a location farther from the side 5X of the semiconductor chip 5 than the substrate-side output electrode 2B. The substrate-side input electrode 2A is placed at about the same distance from the side 5X of the semiconductor chip 5 as the substrate-side output electrode 2B. Thus, the substrate-side bonding electrode 2C is placed not between the substrate-side input electrode 2A and the substrate-side output electrode 2B but at a location farther from the side 5X of the semiconductor chip 5 than the substrate-side input electrode 2A and the substrate-side output electrode 2B. As a result, a gap between the substrate-side input electrode 2A and the substrate-side output electrode 2B can be made narrower by an amount corresponding to the size of an area occupied by the substrate-side bonding electrode 2C. Accordingly, a gap between the first area 5A and the second area 5B of the semiconductor chip 5 can also be narrowed as well, allowing the area occupied by the semiconductor chip 5 to be shrunk.

Further, the substrate-side bonding electrode 2F is placed at a location farther from the other side 5Y of the semiconductor chip 5 than the substrate-side output electrode 2D. The substrate-side input electrode 2E is placed at about the same distance from the other side 5Y of the semiconductor chip 5 as the substrate-side output electrode 2D. Thus, the substrate-side bonding electrode 2F is placed not between the substrate-side input electrode 2E and the substrate-side output electrode 2D but at a location farther from the other side 5Y of the semiconductor chip 5 than the substrate-side input electrode 2E and the substrate-side output electrode 2D. As a result, a gap between the substrate-side input electrode 2E and the substrate-side output electrode 2D can be made narrower by an amount corresponding to the size of an area occupied by the substrate-side bonding electrode 2F. Accordingly, a gap between the first area 5A and the second area 5B of the semiconductor chip 5 can also be narrowed as well, allowing the area occupied by the semiconductor chip 5 to be shrunk.

As shown in FIG. 6, the semiconductor chip 5 has a configuration including a semiconductor substrate 10 as a main component. The semiconductor substrate 10 comprises a p+ semiconductor substrate 10A and a p− epitaxial layer 10B formed on the main surface of the p+ semiconductor substrate 10A which is typically made of monolithic-crystal silicon.

Field-effect transistors constituting the amplifying means PW1 and PW2 are formed in a transistor formation area on the main surface of the semiconductor substrate 10. The field-effect transistors each comprise mainly a p well area 12 used as a channel formation area, a gate insulation film 14, a gate electrode 15 and a pair of an n− semiconductor area 16 and an n+ semiconductor area 17 serving as a source area and a drain area.

The n+ semiconductor area 17 serving as a drain area is electrically connected to a wire 19A formed on a first wiring layer by a connection hole bored through an interlayer insulation film 18. The n+ semiconductor area 17 serving as a source area is electrically connected to a wire 19B formed on the first wiring layer by a connection hole bored through the interlayer insulation film 18. The wire 19B is electrically connected to a p+ semiconductor area 13 formed on a p type epitaxial layer 13 by a connection hole bored through the interlayer insulation film 18. The p+ semiconductor area 13 is electrically connected to the p+ semiconductor substrate 10A. The gate electrode 15 is electrically connected to a wire 19C formed on the first wiring layer by a connection hole bored through the interlayer insulation film 18. It should be noted that this connection is not shown in detail in the figure.

The wire 19A is electrically connected to a wire 21A formed on a second wiring layer by a connection hole bored through an interlayer insulation film 20. Portions of the wire 21A are formed on the chip-side output electrode 6D and the chip-side output electrode 6B. The wire 19B is electrically connected to a wire 21B formed on the second wiring layer by a connection hole bored through the interlayer insulation film 20. Portions of the wire 21B are formed on the electrodes used for probe inspection. The wire 19C is electrically connected to a wire formed on the second wiring layer by a connection hole bored through the interlayer insulation film 20. It should be noted that this connection is not shown in the figure. Portions of the wire are formed on the chip-side input electrode 6A and the chip-side input electrode 6E.

In the third area 5C of the semiconductor chip 5, a wire 19D formed on the first wiring layer is formed on a field insulation film 11 as shown in FIG. 7. The wire 19D is extended in a direction perpendicular to the side 5X of the semiconductor chip 5. The wire 19D is electrically connected to a wire 21D formed on the second wiring layer by a connection hole bored through the interlayer insulation film 20. Much like the wire 19D, the wire 21D is extended in a direction perpendicular to the side 5X of the semiconductor chip 5. Portions of the wire 21D are formed on the chip-side bonding electrode 6C and the chip-side bonding electrode 6F.

A back-surface electrode 21 is formed on the other main surface (or the back surface) facing the main surface of the semiconductor substrate 10 cited earlier. The back-surface electrode 21 is electrically and mechanically connected to the conductive plate 1B formed on the bottom of the dent 1A of the wiring substrate 1. In such an arrangement, the source terminals of the amplifying means PW1 and PW2 are thus set at the fixed reference electric potential.

In the high-frequency power amplifier implemented by this embodiment, the wires 19D and 21D set at a fixed reference electric potential are stretched in a direction perpendicular to the side 5X of the semiconductor chip 5 in the third area 5C (used as an isolation area) between the first area 5A and the second area 5B of the semiconductor chip 5. In addition, the p+ semiconductor area 13 set at the fixed reference electric potential is also stretched in a direction perpendicular to the side 5X of the semiconductor chip 5 in the third area 5C. Moreover, the semiconductor substrate 10 is also set at the fixed reference electric potential. As a result, the semiconductor chip 5 has a configuration in which magnetic-flux interference is suppressed so that the high-frequency characteristic will not deteriorate by all means.

According to the embodiment described above, the following effects are exhibited.

(1) Since the substrate-side bonding electrode 2C is placed at a location farther from the side 5X of the semiconductor chip 5 than the substrate-side input electrode 2A and the substrate-side output electrode 2B are whereas the substrate-side bonding electrode 2F is placed at a location farther from the other side 5Y of the semiconductor chip 5 than the substrate-side input electrode 2E and the substrate-side output electrode 2D are, a gap between the substrate-side input electrode 2A and the substrate-side output electrode 2B can be made narrower by an amount corresponding to the size of an area occupied by the substrate-side bonding electrode 2C. Further, a gap between the substrate-side input electrode 2E and the substrate-side output electrode 2D can be made narrower by an amount corresponding to the size of an area occupied by the substrate-side bonding electrode 2F. Accordingly, a gap between the first area 5A and the second area 5B of the semiconductor chip 5 can also be narrowed as well. As a result, since the area occupied by the semiconductor chip 5 can be shrunk, the high-frequency power amplifier can be made smaller in size.

(2) Since the substrate-side input electrode 2A is placed at about the same distance from the side 5X of the semiconductor chip 5 as the substrate-side output electrode 2B whereas the substrate-side bonding electrode 2C is placed at a location farther from the side 5X of the semiconductor chip 5 than the substrate-side input electrode 2A and the substrate-side output electrode 2B, the wire 7C set at a fixed reference electric potential crosses a gap between the substrate-side input electrode 2A and the substrate-side output electrode 2B. As a result, magnetic-flux interference can be further suppressed in comparison with a case in which the substrate-side bonding electrode 2C is placed between the substrate-side input electrode 2A and the substrate-side output electrode 2B.

It should be noted that, in this embodiment, the wires 7C and 7F are set at a fixed reference electric potential as described above. In addition, since the magnitude of a power flowing through the output wire 7D connected to the drain terminal (serving as the output unit) of the amplifying means PW1 at the front stage is about equal to the magnitude of a power flowing through the input wire 7E connected to the gate terminal (serving as the input unit) of the amplifying means PW2 at the later stage, it is not necessary to specially provide a wire set at a fixed reference electric potential between the output wire 7D and the input wire 7E. In this case, the chip-side bonding electrode 6F and the substrate-side bonding electrode 2F are therefore not required.

In addition, in this embodiment, the substrate-side input electrode 2A is placed at about the same distance from the side 5X of the semiconductor chip 5 as the substrate-side output electrode 2B as described above. It should be noted that the substrate-side input electrode 2A can also be placed at a location farther from the side 5X of the semiconductor chip 5 than the substrate-side bonding electrode 2C. In such an arrangement, the same effects as the embodiment are exhibited. In this case, however, since the input wire 7A becomes longer, the high-frequency characteristic deteriorates to a certain degree.

Second Embodiment

Figure 8:
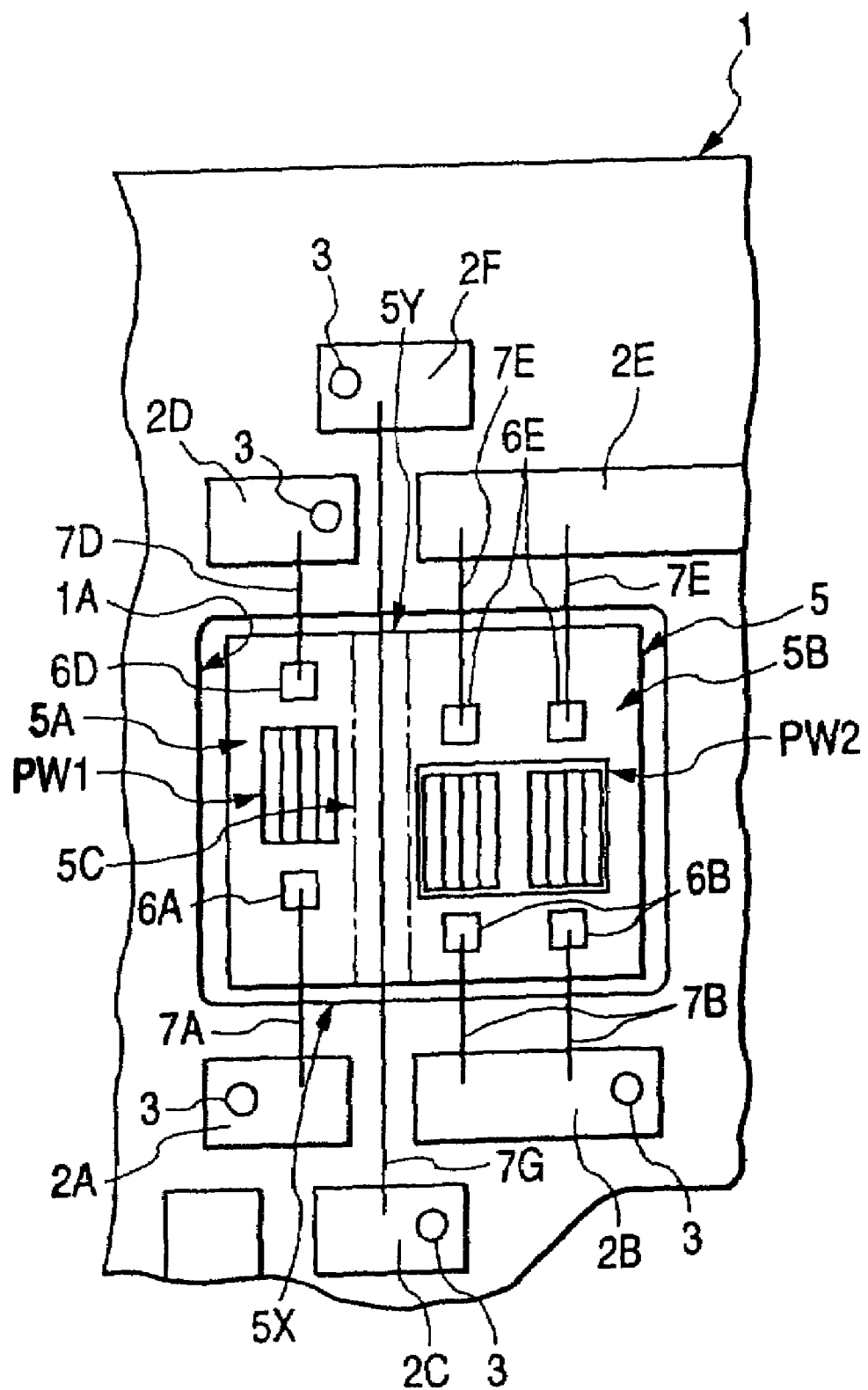
FIG. 8 is a diagram showing a top view of principal parts of a wiring substrate of a high-frequency power amplifier implemented by a second embodiment of the present invention.

FIG. 8 is a diagram showing a top view of principal parts of a wiring substrate of a high-frequency power amplifier implemented by a second embodiment of the present invention.

The high-frequency power amplifier implemented by the second embodiment basically has the same configuration as the first embodiment except for the following differences.

As shown in FIG. 8, the substrate-side bonding electrode 2C is electrically and mechanically connected to one end of a wire 7G stretched over the third area 5C of the semiconductor chip 5 and the substrate-side bonding electrode 2F is electrically and mechanically connected to the other end of the wire 7C. Since the substrate-side bonding electrode 2C and the substrate-side bonding electrode 2F are electrically connected to the reference-potential external terminal 4, the wire 7G is set at the fixed reference electric potential.

Since the substrate-side bonding electrodes 2C and 2F are electrically and mechanically connected the ends of the wire 7G as described above, it is possible to prevent the high-frequency characteristic from deteriorating due to a mutual-induction effect between the input wire 7A and the output wire 7B and a mutual-induction effect between the output wire 7D and the input wire 7E.

Third Embodiment

Figure 9:
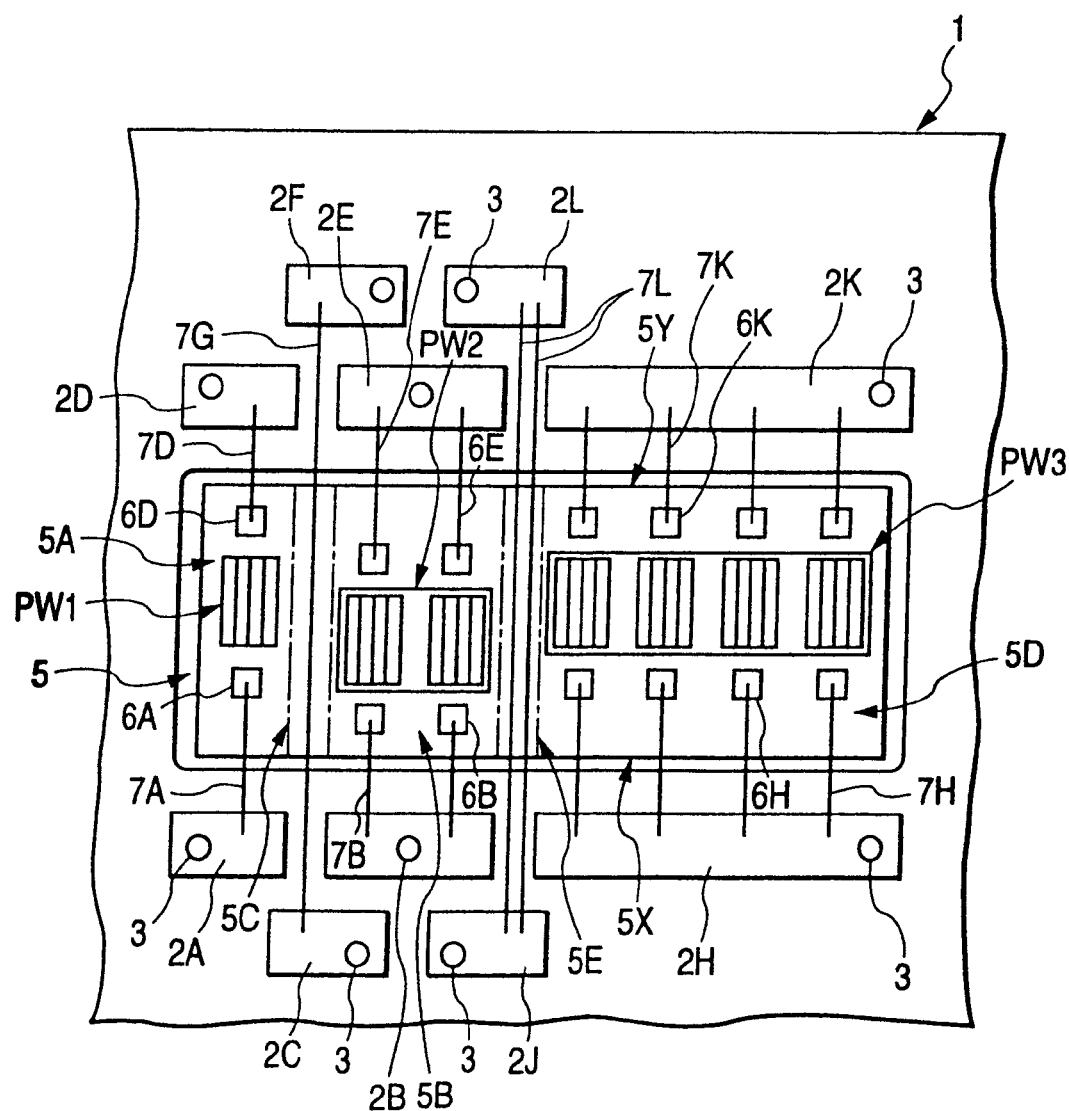
FIG. 9 is a diagram showing a top view of principal parts of a wiring substrate of a high-frequency power amplifier implemented by a third embodiment of the present invention.

FIG. 9 is a diagram showing a top view of principal parts of a wiring substrate of a high-frequency power amplifier implemented by a third embodiment of the present invention.

The high-frequency power amplifier implemented by the third embodiment basically has the same configuration as the first embodiment except for the following differences.

As shown in FIG. 9, the amplifying means PW1, PW2 and PW3 are formed on a single semiconductor chip 5. The amplifying means PW3 is formed in a fourth area 5D of the main surface of the semiconductor chip 5.

Formed in the fourth area 5D of the main surface of the semiconductor chip 5, the gate terminal (serving as the input unit) of the amplifying means PW3 is electrically connected to a chip-side input electrode 6H in close proximity to the side 5X (a long side in the case of this embodiment) of the semiconductor chip 5. Formed in the fourth area 5D of the main surface of the semiconductor chip 5, the drain terminal (serving as the output unit) of the amplifying means PW3 is electrically connected to a chip-side output electrode 6K in close proximity to the other side 5Y (another long side in the case of this embodiment) of the semiconductor chip 5 facing the side 5X. Much like the amplifying means PW1, the source terminal of the amplifying means PW3 is electrically connected to a back-surface electrode 21 formed on a back surface of the semiconductor chip 5.

A fifth area 5E (serving as an isolation area) is formed between the fourth area 5D and the second area 5B on the main surface of the semiconductor chip 5 to electrically separate the fourth area 5D and the second area 5B from each other.

The chip-side input electrode 6H is electrically connected by a wire 7H to a substrate-side input electrode 2H which is formed on the main surface of the wiring substrate 1 to face the side 5X of the semiconductor chip 5. The substrate-side input electrode 2H is electrically connected by an internal wire and a through-hole wire 3 bored at a location right below the substrate-side input electrode 2H to the substrate-side output electrode 2B.

The chip-side output electrode 6K is electrically connected by a wire 7K to a substrate-side output electrode 2K which is formed on the main surface of the wiring substrate 1 to face the other side 5Y of the semiconductor chip 5. The substrate-side output electrode 2K is electrically connected by an internal wire and a through-hole wire 3 bored at a location right below the substrate-side bonding electrode 2F to the output external terminal formed on the back surface of the wiring substrate 1.

A substrate-side bonding electrode 2J is formed on the main surface of the wiring substrate 1 to face the side 5X of the semiconductor chip 5. On the other hand, a substrate-side bonding electrode 2L is formed on the main surface of the wiring substrate 1 to face the side 5Y of the semiconductor chip 5. Much like the substrate-side bonding electrode 2C, the substrate side bonding electrodes 2J and 2L are electrically connected to the reference-potential terminal 4 formed on the back surface of the wiring substrate 1.

The substrate-side bonding electrode 2J is placed at about the same distance from the side 5X of the semiconductor chip 5 as the substrate-side bonding electrode 2C. On the other hand, the substrate-side bonding electrode 2L is placed at about the same distance from the other side 5Y of the semiconductor chip 5 as the substrate-side output electrode 2F.

The substrate-side bonding electrode 2J is electrically and mechanically connected to one end of a wire 7L stretched over the fifth area 5E of the semiconductor chip 5 and the substrate-side bonding electrode 2L is electrically and mechanically connected to the other end of the wire 7L.

In the high-frequency power amplifier implemented by this embodiment, two wires 7L are provided. A difference between a power flowing through the input wire 7E and a power flowing through the output wire 7K is larger than a difference between a power flowing through the input wire 7A and a power flowing through the output wire 7B. By increasing the number of wires set at the fixed reference electric potential in accordance with the difference in power as is the case with this embodiment, it is possible to prevent the high-frequency characteristic from deteriorating due to a mutual-induction effect between an input wire and an output wire in a more stable state.

Fourth Embodiment

Figure 10:
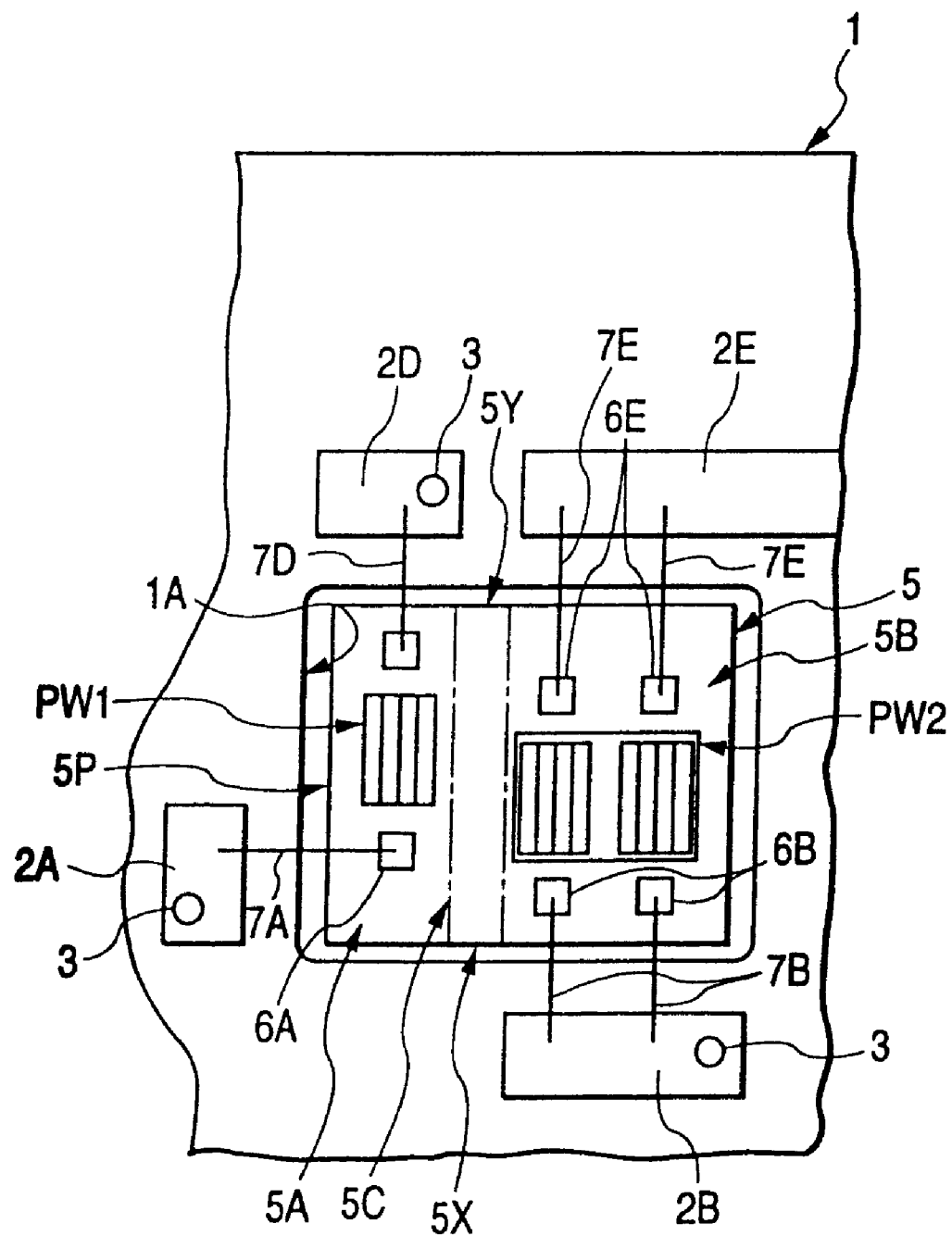
FIG. 10 is a diagram showing a top view of principal parts of a wiring substrate of a high-frequency power amplifier implemented by a fourth embodiment of the present invention.

FIG. 10 is a diagram showing a top view of principal parts of a wiring substrate of a high-frequency power amplifier implemented by a fourth embodiment of the present invention.

The high-frequency power amplifier implemented by the fourth embodiment basically has the same configuration as the first embodiment except for the following differences.

As shown in FIG. 10, the substrate-side output electrode 2B is placed at a location facing the side 5X of the semiconductor chip 5 while the substrate-side input electrode 2A is placed at a location facing another side 5P crossing the side 5X of the semiconductor chip 5.

Since the substrate-side output electrode 2B is placed at a location facing the side 5X of the semiconductor chip 5 while the substrate-side input electrode 2A is placed at a location facing the other side 5P crossing the side 5X of the semiconductor chip 5 as described above, a magnetic flux of the input wire 7A perpendicularly crosses a magnetic flux of the output wire 7B. As a result, a mutual-induction effect between the input wire 7A and the output wire 7B is suppressed.

In addition, since it is not necessary to provide a substrate-side bonding electrode for connecting a wire set at the fixed reference electric potential, a gap between the first area 5A and the second area 5B of the semiconductor chip 5 can be narrowed. Thus, the area occupied by the semiconductor chip 5 can be shrunk. As a result, the high-frequency power amplifier can be made smaller in size.

Fifth Embodiment

Figure 15:
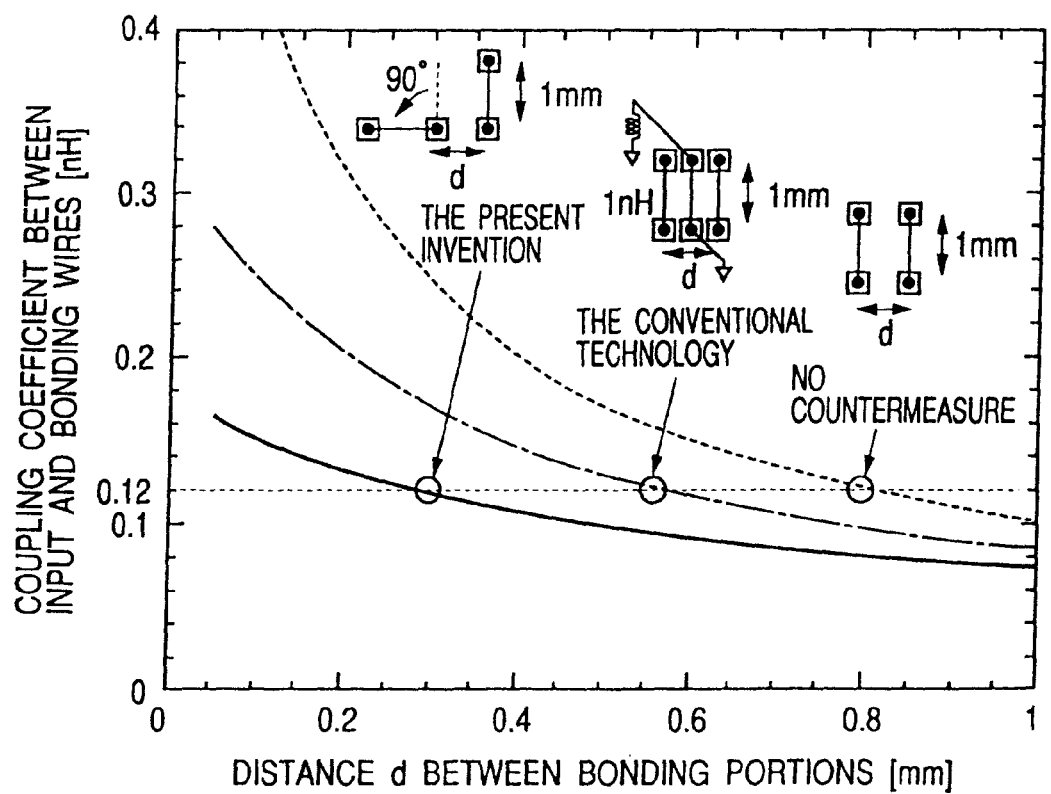
FIG. 15 is a diagram showing curves relating a coupling coefficient between input and output wires to a gap between bonding portions for the present invention and the conventional technology.
Figure 16:
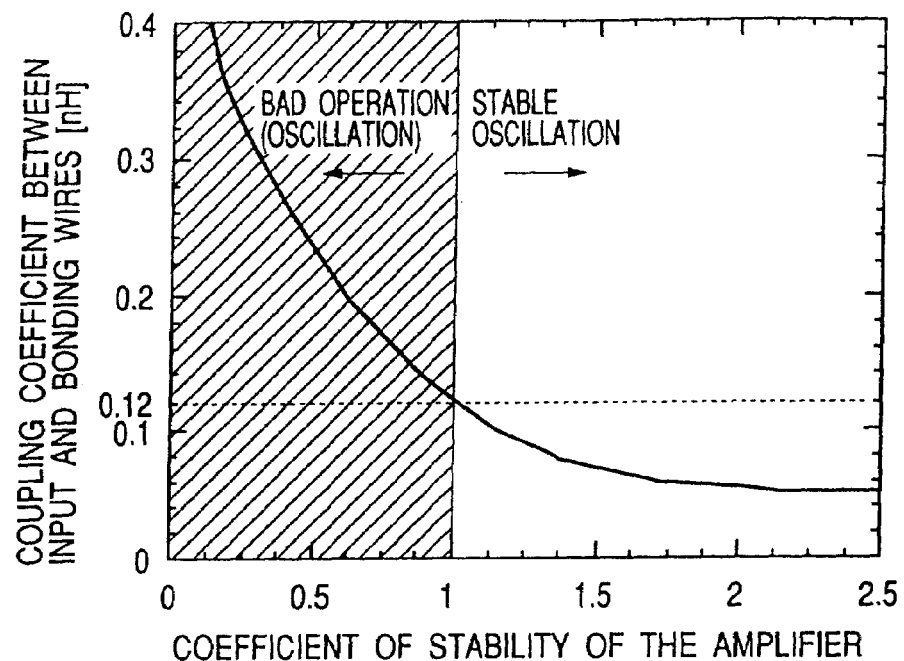
FIG. 16 is a diagram showing a curve relating the coupling coefficient between input and output wires to a coefficient of stability as obtained as a result of a study conducted by the inventors of the present invention.

As shown in FIG. 15, the present invention provides coupling coefficients smaller than those of the conventional technology, improving the high-frequency characteristic. In addition, for coupling coefficients not exceeding 0.12 (or for coefficients of stability greater than 1), a range of the distance d between bonding portions becomes wider, raising the degree of design freedom. Moreover, the distance d between bonding portions can be decreased to 0.3 mm, allowing the chip area to be made smaller. As a result, the high-frequency power amplifier module can be made small in size and the cost thereof can be reduced.

Figure 17:
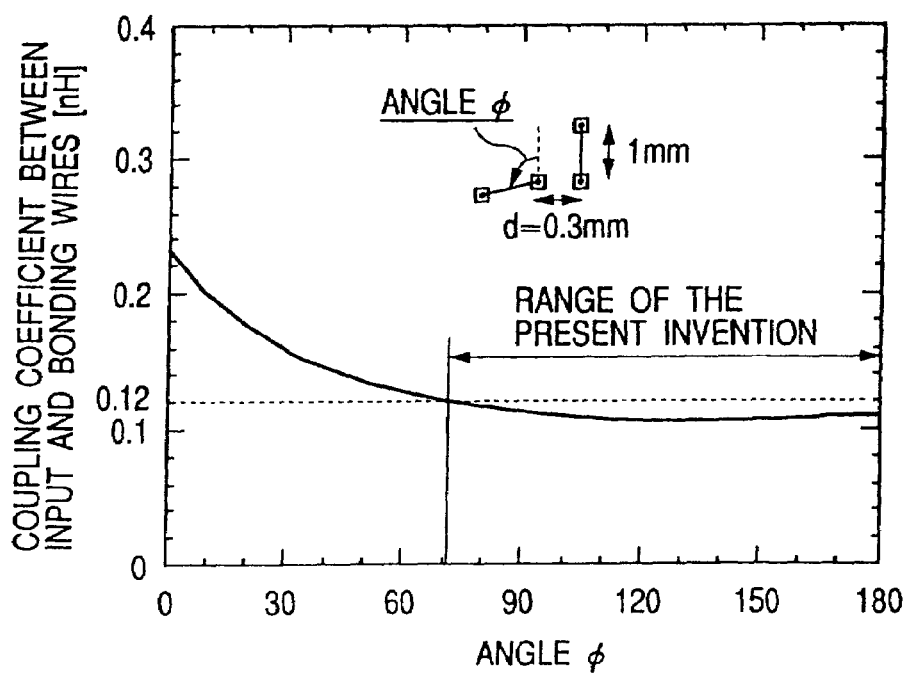
FIG. 17 is a diagram showing a curve relating the coupling coefficient between input and output wires to a chip-design angle as obtained as a result of a study conducted by the inventors of the present invention.

FIG. 15 shows a case in which an angle φ formed by an input bonding wire and an output bonding wire is set at 90 degrees. As shown in FIG. 17, the angle φ can be set at a value in the range 72 degrees to 180 degrees. At an angle φ of 140 degrees, the coupling coefficient is equal to a minimum. It is thus obvious that a local minimum point exists.

In the actual design of a high-frequency power amplifier module provided by the present invention, a distance d between bonding portions and the angle φ are selected on the basis of the above consideration.

In addition, as is obvious from the above description, to set the angle φ at a value other than 0 degrees is the basis underlying the present invention. Thus, a high-frequency power amplifier module can be designed to give a coefficient of stability of at least 1 for two amplifying-stage transistors associated with input and output bonding wires by setting the angle θ at a value in the range 72 degrees to 180 degrees.

Figure 11:
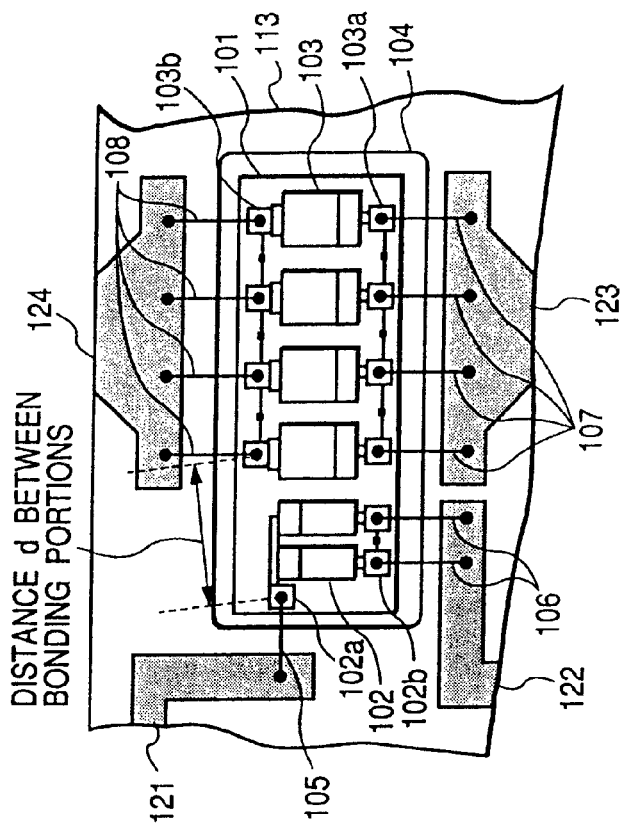
FIG. 11 is a diagram showing a top view of principal parts of a two-stage power amplifier module implemented by a fifth embodiment of the present invention.
Figure 12:
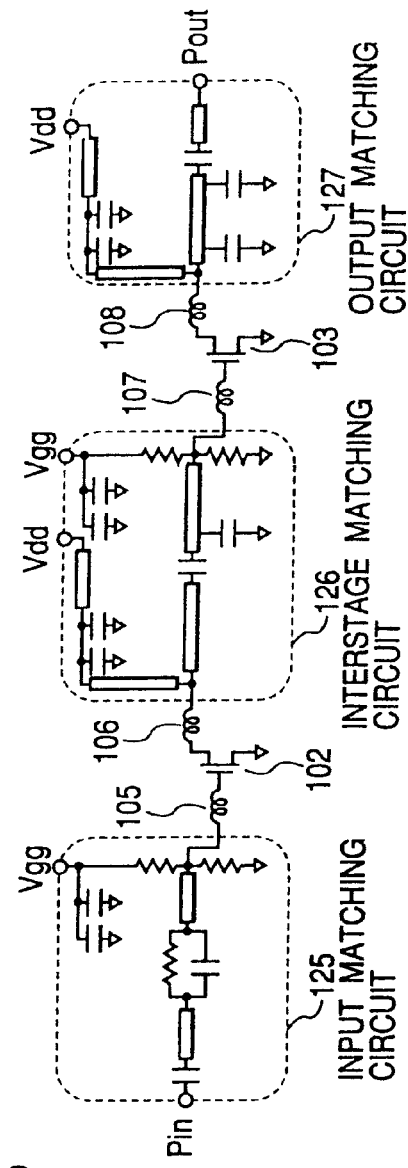
FIG. 12 is a diagram showing an equivalent circuit diagram of the two-stage power amplifier module implemented by the fifth embodiment of the present invention.
Figure 13:
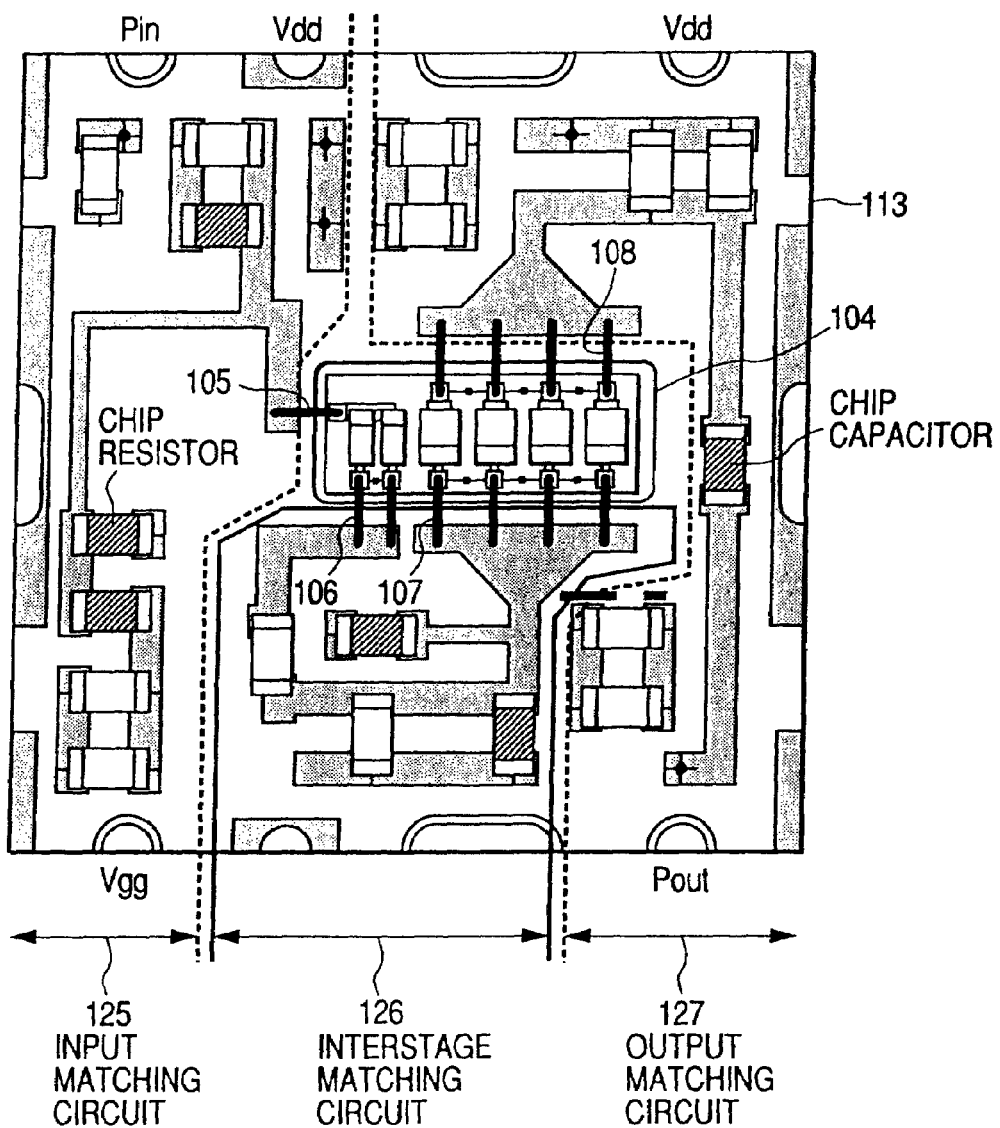
FIG. 13 is a diagram showing a top view of an external configuration of the two-stage power amplifier module implemented by the fifth embodiment of the present invention.
Figure 14:
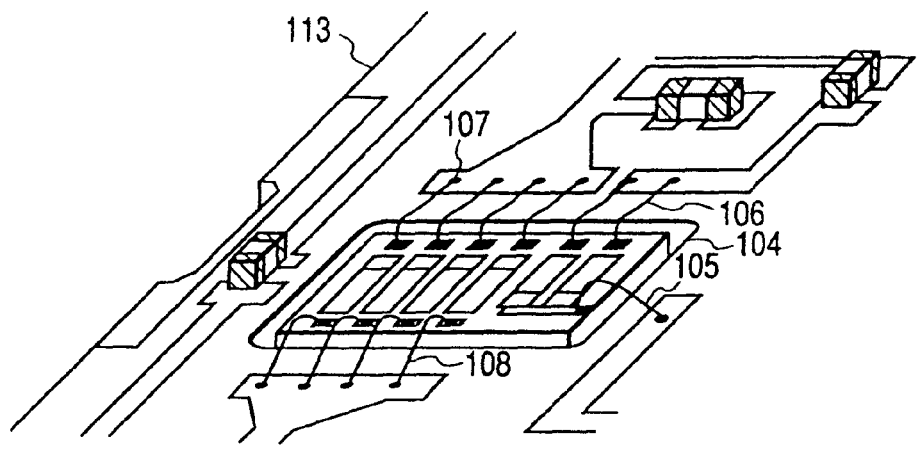
FIG. 14 is a diagram showing a perspective view of principal parts of the two-stage power amplifier module implemented by the fifth embodiment of the present invention.

A two-stage power amplifier module provided by the fifth embodiment of the present invention is explained below by referring to FIGS. 11 to 14. FIG. 11 is a diagram showing a top view of principal parts of the two-stage power amplifier module and FIG. 12 is a diagram showing an equivalent circuit of the two-stage power amplifier module. FIG. 13 is a diagram showing a top view of an external configuration of the two-stage power amplifier module and FIG. 14 is a diagram showing a perspective view of principal parts of the two-stage power amplifier module.

As shown in FIG. 11, transistors 102 and 103 each implemented by a MOSFET at the first and second stages respectively are formed on a silicon chip 101 at locations close to each other. The transistors 102 and 103 are laid out so that the direction of a high-frequency signal flowing from the gate electrode 102a of the first-stage transistors 102 to the drain electrodes 102b thereof is opposite to the direction of a high-frequency signal flowing from the gate electrodes 103a of the second-stage transistors 103 to the drain electrodes 103b thereof.

The gate electrode 102a serving as the high-frequency input terminal is connected to a terminal 121 of an input matching circuit 125 on a wiring substrate 113 by one input bonding wire 105. On the other hand, the drain electrodes 103b serving as the high-frequency output terminal are connected to a terminal 124 of an output matching circuit 127 on the wiring substrate 113 by four output bonding wires 108. The gate electrode 102a is placed at a location in close proximity to the left side of the silicon chip 101 whereas the drain electrodes 103b are placed at locations in close proximity to the upper side of the silicon chip 101. An angle formed by the input bonding wire 105 and the output binding wires 108 is thus about 90 degrees. The drain electrodes 102b are connected to a terminal 122 of an interstage matching circuit 126 on the wiring substrate 113 by bonding wires 106. On the other hand, the gate electrodes 103a are connected to a terminal 123 of the interstage matching circuit 126 by bonding wires 107. The distance between the bonding portion of the gate electrode 102a (or the bonding input electrode) of the first-stage transistors 102 and the bonding portion of the drain electrodes 103b (or the bonding output electrodes) of the second-stage transistors 103 is about 0.6 mm.

The silicon chip 101 is mounted in a cavity 104 formed on the wiring substrate 113. Metallic films serving as the source electrodes of the first-stage and second-stage transistors 102 and 103 are attached to the back surface of the silicon chip 101 and connected to the electric potential of the ground by wires in the cavity 104. The wiring substrate 113 is made of a dielectric material such as glass ceramics or alumina. On the other hand, wires in the wiring substrate 113 are made of copper, silver or silver platinum.

In FIGS. 12 and 13, notations $P_{in}$, $P_{out}$, $V_{gg}$ and $V_{dd}$ denote a high-frequency signal input terminal, a high-frequency output terminal, a gate-voltage applying terminal and a drain-voltage applying terminal respectively which are each an external connection terminal of the power amplifier module. In FIG. 13, a hatched line indicates a boundary between the input matching circuit 125 and the interstage matching circuit 126 or a boundary between the interstage matching circuit 126 and the output matching circuit 127. FIG. 14 is a diagram showing a 3-dimensional structure of parts surrounding the cavity 104.

In this embodiment, an angle formed by the input bonding wire 105 and the output binding wires 108 is set at about 90 degrees as described above. It should be noted, however, that this angle can be set at any value in the range 72 degrees to 180 degrees.

Sixth Embodiment

Figure 18:
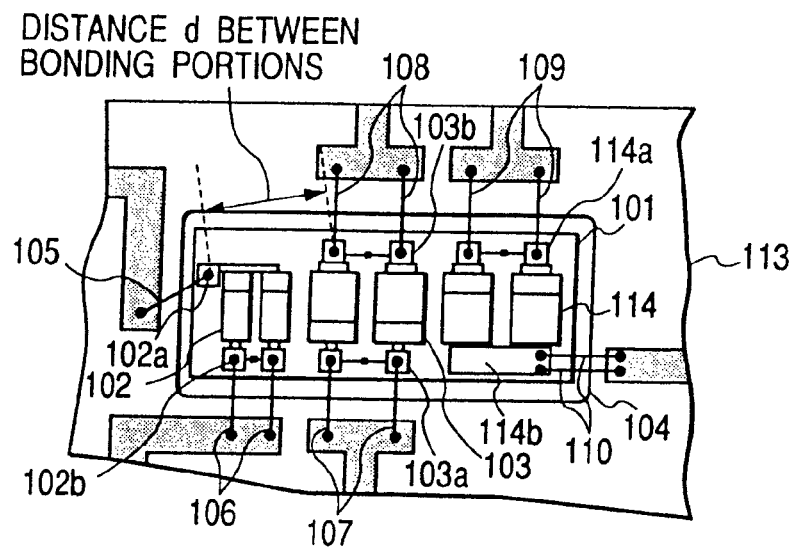
FIG. 18 is a diagram showing a top view of principal parts of a three-stage power amplifier module implemented by a sixth embodiment of the present invention.

A three-stage power amplifier module implemented by a sixth embodiment of the present invention is explained by referring to a diagram of FIG. 18 showing a top view of principal parts thereof. As shown in the figure, transistors 102, 103 and 114 each implemented by a MOSFET at the input, intermediate and output stages respectively are formed on a silicon chip 101 at locations close to each other. The transistors 102 and 103 are laid out so that the direction of a high-frequency signal flowing from the gate electrode 102a of the input-stage transistors 102 to the drain electrodes 102b thereof is opposite to the direction of a high-frequency signal flowing from the gate electrodes 103a of the intermediate-stage transistors 103 to the drain electrodes 103b thereof. Further, the transistors 103 and 114 are laid out so that the direction of a high-frequency signal flowing from the gate electrode 103a of the intermediate-stage transistors 103 to the drain electrodes 103b thereof is opposite to the direction of a high-frequency signal flowing from the gate electrodes 114a of the output-stage transistors 114 to the drain electrodes 114b thereof.

The sixth embodiment is different from the fifth embodiment in that, in the case of the former, the present invention is applied as follows. An angle formed by the input bonding wire 105 of the input-stage transistors 102 and the output binding wires 108 of the intermediate-stage transistors 103 is set at about 140 degrees; the transistors 114 at the output stage are provided on the same chip; an angle formed by the output bonding wires 110 of the output-stage transistors 114 and the input binding wires 107 of the intermediate-stage transistors 103 is set at about 90 degrees; and the distance d between the bonding portion of the gate electrodes 103a (or the bonding input electrodes) of the intermediate-stage transistors 103 and the bonding portion of the drain electrodes 114b (or the bonding output electrodes) of the output-stage transistors 114 is about 0.7 mm.

According to this embodiment, a coupling coefficient between the input bonding wire 105 of the input-stage transistors 102 and the output bonding wires 108 of the intermediate-stage transistors 103 can be reduced to a minimum as shown in FIG. 17, allowing isolation between the input bonding wire 105 and the output bonding wires 108 to be further improved. In addition, since the present invention is applied, isolation between the input bonding wires 107 of the intermediate-stage transistors 103 and the output bonding wires 109 of the output-stage transistors 114 can be assured as well. As a result, in the case of the sixth embodiment wherein transistors at three-stages are formed on the same chip in order to shrink the area of the semiconductor chip, the high-frequency characteristic can be improved in spite of the fact that distances between transistors are shorter.

Seventh Embodiment

Figure 19:
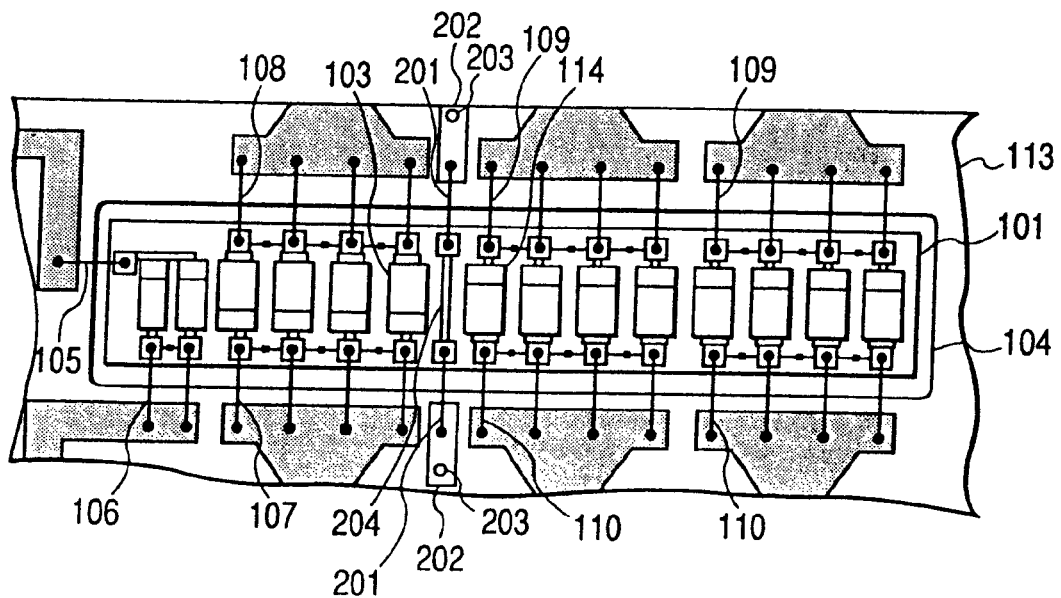
FIG. 19 is a diagram showing a top view of principal parts of a three-stage power amplifier module implemented by a seventh embodiment of the present invention.

A three-stage power amplifier module implemented by a seventh embodiment of the present invention is explained by referring to a diagram of FIG. 19 showing a top view of principal parts thereof. The seventh embodiment is different from the sixth embodiment in that, in the case of the former, a shield bonding wire 201 and a shield wire 204 are provided between an intermediate-stage transistor 103 and an output-stage transistor 114 by applying a shield technology, and one end of the shield bonding wire 201 and one end of the shield wire 204 are each connected to the electric potential of the ground by an electrode 202 and a via hole 203 formed on the wiring substrate.

In this embodiment, the conventional shield technology is applied to a gap between the input and intermediate stages. Since the sizes of the areas of the transistors at the input and intermediate stages are large from the beginning, however, the high-frequency characteristic can be improved.

Eighth Embodiment

Figure 20:
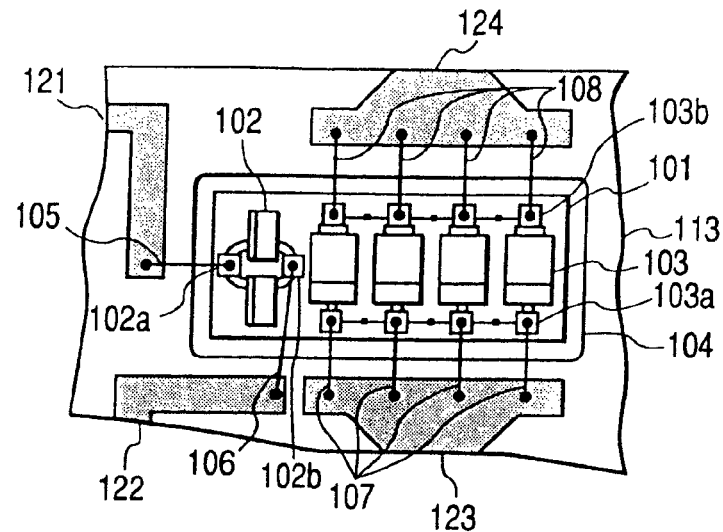
FIG. 20 is a diagram showing a top view of principal parts of a two-stage power amplifier module implemented by an eighth embodiment of the present invention.
Figure 21:
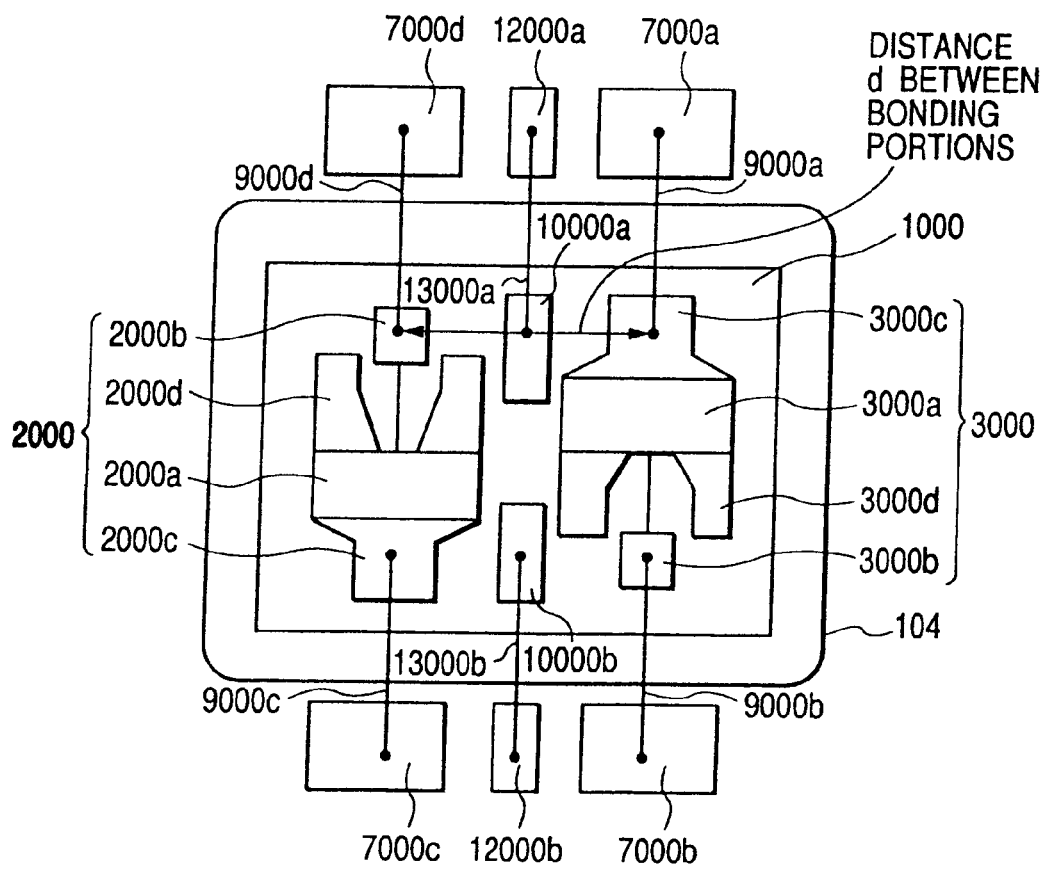
FIG. 21 is a diagram showing a top view of the conventional two-stage power amplifier module.
Figure 22:
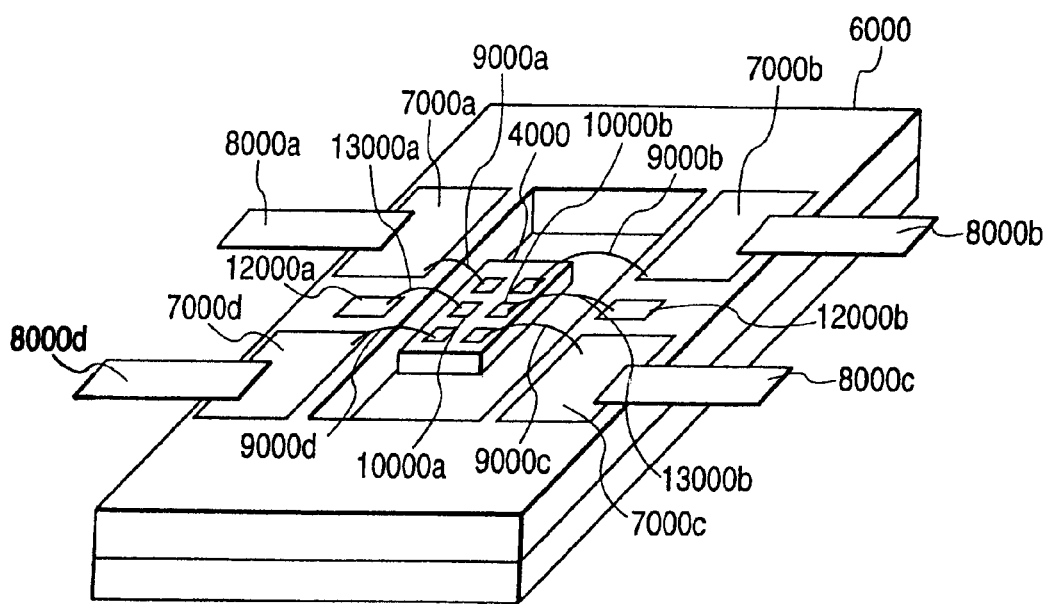
FIG. 22 is a diagram showing a perspective view of the conventional two-stage power amplifier module.

A two-stage power amplifier module implemented by an eighth embodiment of the present invention is explained by referring to a diagram of FIG. 20 showing a top view of principal parts thereof.

The eighth embodiment is different from the fifth embodiment in that, in the case of the former, the orientation of the first-stage transistors 102 is rotated by 90 degrees.

In this embodiment, since the locations of the bonding portions of the input bonding wire 105 at the first stage and the output bonding wires 108 at the second stage are moved to the center of the chip, the distance between the bonding portions can be made even longer. (In the case of the first embodiment, the distance is 0.6 mm. In the case of the eighth embodiment, on the other hand, the distance is 0.75 mm). As a result, the isolation between the input bonding wire 105 at the first stage and the output bonding wires 108 at the second stage can be further improved.

Preferred embodiments of the present invention have been explained so far. It should be noted, however, that the scope of the present invention is not limited to the embodiments. For example, parameters such as the number of electrodes of transistors and the number of bonding wires can be changed to a variety of values in dependence on the application without deviating from the gist of the present invention. In addition, the transistors do not have to be each implemented by a MOSFET, but they can also be each implemented by a field-effect transistor or a hetero-junction bipolar transistor (HBT).

What is claimed is:

1. A semiconductor device including an RF power amplifier circuit, comprising:
  (a) a semiconductor chip, the semiconductor chip including:
    an input stage transistor of the RF power amplifier circuit having a first input node and a first output node,
    an intermediate stage transistor of the RF power amplifier circuit having a second input node and a second output node, the first output node being electrically coupled to the second input node,
    an output stage transistor of the RF power amplifier circuit having a third input node and a third output node, the second output node being electrically coupled to the third input node; and
  (b) a mounting substrate having a main surface over which the semiconductor chip is mounted;
    wherein the mounting substrate has a back surface opposite to the main surface;
    a plurality of external terminals are disposed over the back surface;
    one of the external terminals is electrically coupled to the first input node; and
    another one of the external terminals is electrically coupled to the third output node; and
    wherein a conductive plate is formed over the main surface of the wiring substrate,
    the semiconductor chip is disposed over the conductive plate,
    a through-hole wire is formed right below the conductive plate in the wiring substrate, the plurality of external terminals includes a reference-potential external terminal, the conductive plate and the reference-potential external terminal are electrically connected via the through-hole wire.

2. A semiconductor device according to claim 1, wherein
an input terminal is disposed over the main surface of the mounting substrate,
an output terminal is disposed over the main surface of the mounting substrate,
an input bonding wire is disposed over the main surface of the mounting substrate and electrically couples the input terminal and the first input node.

3. A semiconductor device according to claim 1, wherein a capacitive element is disposed over the main surface of mounting substrate.

4. A semiconductor device according to claim 1, wherein a resistive element is disposed over the main surface of the mounting substrate.

5. A semiconductor device according to claim 1, wherein the input stage, intermediate stage and output stage transistors are hetero-junction bipolar transistors.

6. A semiconductor device according to claim 1, wherein the mounting substrate is comprised of laminated insulating layers.

7. A semiconductor device according to claim 2, wherein the capacitive element is electrically coupled to the third output node.

* * * * *